United States Patent
Papanikolaou

(10) Patent No.: US 12,438,510 B2
(45) Date of Patent: Oct. 7, 2025

(54) STAGGERING GAIN ADJUSTMENTS OF AMPLIFIERS

(71) Applicant: MACOM Technology Solutions Holdings, Inc., Lowell, MA (US)

(72) Inventor: Vasilis Papanikolaou, Lowell, MA (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 322 days.

(21) Appl. No.: 18/214,660

(22) Filed: Jun. 27, 2023

(65) Prior Publication Data
US 2025/0007479 A1    Jan. 2, 2025

(51) Int. Cl.
*H03F 1/32*      (2006.01)
*H03F 3/45*      (2006.01)
*H03G 3/30*      (2006.01)

(52) U.S. Cl.
CPC ......... *H03G 3/3042* (2013.01); *H03F 1/3211* (2013.01); *H03F 3/45475* (2013.01); *H03G 3/3089* (2013.01); *H03F 2200/411* (2013.01)

(58) Field of Classification Search
None
See application file for complete search history.

(56) References Cited

U.S. PATENT DOCUMENTS

| | | |
|---|---|---|
| 8,139,670 B1 | 3/2012 | Son et al. |
| 8,577,305 B1 | 11/2013 | Rossi et al. |
| 8,884,801 B1 | 11/2014 | Ranjbar |
| 9,887,862 B2 | 2/2018 | Zhou et al. |
| 2019/0052236 A1* | 2/2019 | Sugimoto ............... H03F 3/082 |

* cited by examiner

Primary Examiner — Idowu O Osifade
(74) Attorney, Agent, or Firm — Jason H. Vick; Amped IP LLC

(57) ABSTRACT

Adjustments to gain levels, associated with amplifiers, including partial adjustments to gain levels associated with certain amplifiers can be controlled and performed in accordance with an amplifier gain adjustment sequence. In response to determining that an overall gain level associated with a group of amplifiers, comprising first, second, and third amplifiers, is to be reduced, AGC component can determine whether a third gain level associated with the third amplifier is at a minimum. In response to determining that third gain level is at minimum, AGC component can determine which of a first gain level associated with the first amplifier and a second gain level associated with the second amplifier is to be partially reduced, in accordance with the amplifier gain adjustment sequence that, in part, specifies alternating between partial first gain level reductions associated with the first amplifier and partial second gain level reductions associated with the second amplifier.

20 Claims, 6 Drawing Sheets

STAGGERING GAIN ADJUSTMENTS OF AMPLIFIERS

TECHNICAL FIELD

The subject disclosure relates generally to electronic circuitry, e.g., to staggering gain adjustments of amplifiers.

BACKGROUND

Many types of electrical devices can employ amplifiers to process or amplify electrical signals (e.g., voltage signals or other signals). For example, a transimpedance amplifier (TIA) can be utilized to convert a current signal to a voltage signal and/or amplify the voltage signal (e.g., apply a gain to the voltage signal). As another example, a voltage gain amplifier (VGA) can receive a voltage signal and can amplify the voltage signal by applying a gain to the voltage signal. These and other types of amplifiers can be utilized, along with other types of electronic components, to enable a device to perform desired functions or operations.

The above-described description is merely intended to provide a contextual overview relating to existing technology and is not intended to be exhaustive.

SUMMARY

The following presents a simplified summary in order to provide a basic understanding of some aspects described herein. This summary is not an extensive overview of the disclosed subject matter. It is intended to neither identify key or critical elements of the disclosure nor delineate the scope thereof. Its sole purpose is to present some concepts in a simplified form as a prelude to the more detailed description that is presented later.

In some embodiments, the disclosed subject matter can comprise a system that can facilitate gain adjustments. The system can comprise a group of amplifier components, which can comprise a transimpedance amplifier component, a first voltage gain amplifier component, and a second voltage gain amplifier component. The transimpedance amplifier component can receive an input signal, wherein the second voltage gain amplifier component can generate a voltage signal, and wherein an output signal of the system can be based at least in part on the voltage signal. The system also can comprise an automatic gain control component that can be associated with the group of amplifier components. In response to a determination that a third gain level associated with the second voltage gain amplifier component satisfies a defined gain level, the automatic gain control component can determine which of a first gain level associated with the transimpedance amplifier component and a second gain level associated with the first voltage gain amplifier component is to be partially reduced, in accordance with an amplifier gain adjustment sequence that, in part, specifies alternating between partial first gain level reductions associated with the transimpedance amplifier component and partial second gain level reductions associated with the first voltage gain amplifier component.

In certain embodiments, the disclosed subject matter can comprise a device that can facilitate gain modifications. The device can include a group of amplifier components, which can comprise a first amplifier component, a second amplifier component, and a third amplifier component. The first amplifier component can receive an input signal, wherein the third amplifier component can generate a voltage signal, and wherein an output signal associated with the group of amplifier components can be based at least in part on the voltage signal. The device also can comprise a controller component that can be associated with the group of amplifier components. In response to a determination that a third gain level associated with the third amplifier component satisfies a defined threshold gain level, the controller component can determine which of a first gain level associated with the first amplifier component and a second gain level associated with the second amplifier component is to be partially decreased, in accordance with an amplifier gain modification arrangement that, in part, indicates alternating between partial first gain level decreases associated with the first amplifier component and partial second gain level decreases associated with the second amplifier component.

In still other embodiments, the disclosed subject matter can comprise a method that can facilitate gain adjustments. The method can comprise: in response to determining that an overall gain level associated with a group of amplifiers, comprising a first amplifier, a second amplifier, and a third amplifier, is to be reduced, determining whether a third gain level associated with the third amplifier satisfies a defined threshold gain level, wherein the first amplifier can receive an input signal, wherein the third amplifier can generate a voltage signal, and wherein an output signal associated with the group of amplifiers can be based at least in part on the voltage signal. The method also can comprise: in response to determining that the third gain level associated with the third amplifier satisfies the defined threshold gain level, determining which of a first gain level associated with the first amplifier and a second gain level associated with the second amplifier is to be partially reduced, in accordance with an amplifier gain adjustment sequence that, in part, specifies alternating between partial first gain level reductions associated with the first amplifier and partial second gain level reductions associated with the second amplifier.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
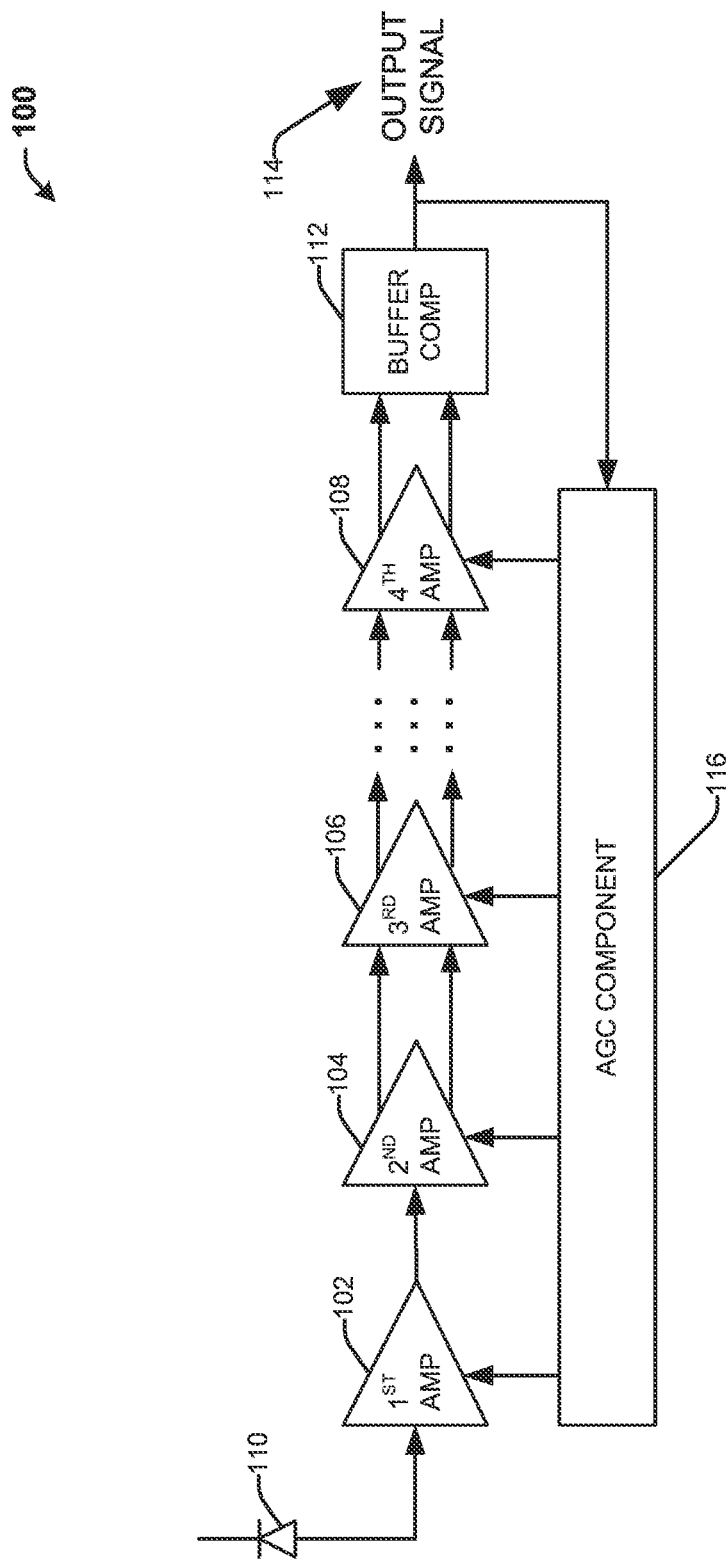
FIG. 1 illustrates a block diagram of a non-limiting example system that can desirably control adjustments to gain levels associated with amplifier components, in accordance with an amplifier gain adjustment sequence that can facilitate alternating partial gain level reductions associated with some of the amplifier components, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

Many types of electrical devices can employ amplifiers, such as a transimpedance amplifier (TIA) and/or a voltage gain amplifier (VGA), to process or amplify electrical signals (e.g., voltage signals or other signals). The amplifiers can be utilized, along with other types of electronic components, to enable a device to perform desired functions or operations.

Some devices can employ multiple amplifiers that each can apply gain to an input electrical signal (e.g., in succession) to increase the level of the signal to produce an output signal that can have a desired output voltage level. As the input signal increases in level, it may be desirable to reduce the gain of one or more of the amplifiers to achieve the desired (e.g., target or wanted) output voltage level, and as the input signal decreases in level, it may be desirable to increase the gain of one or more of the amplifiers to achieve the desired output voltage level.

For instance, a device can employ a set of amplifiers, such as four amplifiers, where the amplifiers can be connected to form a chain of amplifiers (e.g., first amplifier output connected to input of second amplifier, output of second amplifier connected to the input of the third amplifier, and output of the third amplifier connected to the input of the fourth amplifier) that can receive an input signal (e.g., input current signal) at the first amplifier (e.g., TIA) and produce an output voltage signal as an output from the fourth (e.g., last) amplifier (e.g., VGA), via a buffer, with one or more amplifiers applying gain to the signal as the signal proceeds through the chain of amplifiers. If the gain associated with the amplifiers is to be reduced, for example, due to an increase in the input signal, existing techniques for reducing gain for the set of amplifiers can involve first reducing the gain level of the fourth amplifier (e.g., last VGA) until it is at its lowest gain level, followed by reducing the gain level of the third amplifier (e.g., another VGA) until the gain level of the third amplifier is at its lowest level, followed by reducing the gain level of the second amplifier (e.g., still another VGA) until the gain level of the second amplifier is at its lowest level, and/or followed by reducing the gain level of the first amplifier (e.g., TIA), until the desired output signal is achieved.

However, such existing techniques for reducing gain associated with a set of amplifier components can be deficient as they typically can have to undesirably sacrifice good sensitivity (e.g., resulting in less sensitivity) of the device so that the device may have better overload (e.g., higher overload in decibel (dB)-milliwatts (dBm) or bit error rate (BER) floor characteristics, or undesirably sacrifice good overload (e.g., resulting in lower overload) of the device so that the device may have better sensitivity or BER floor characteristics, or undesirably sacrifice a good BER floor of the device so that the device may have better sensitivity or overload characteristics. Also, such existing techniques for reducing gain associated with a set of amplifier components can be deficient as they typically can be unable to provide an output signal that can have a maximally flat frequency response, and/or the TIA and/or the first VGA (e.g., second amplifier, which can be $VGA_0$), adjacent to the TIA, typically can be burdened with an undesirably high voltage swing at their respective outputs, which can undesirably (e.g., negatively) impact the linearity of the TIA and/or first VGA, as the TIA and/or the first VGA sometimes can have large input signals (e.g., input current signal that is input to the TIA, or input voltage signal that is input to the first VGA) that can undesirably impact the ability of the TIA and/or the first VGA to linearly amplify the respective input signals.

The disclosed subject matter can overcome these and other deficiencies of existing systems, devices, and techniques that adjust gain levels of amplifiers.

In accordance with various embodiments, the disclosed subject matter can comprise a system that can comprise a group of amplifier components, comprising a first amplifier component (e.g., a transimpedance amplifier (TIA) or other desired type of amplifier component), a second amplifier component (e.g., a variable gain amplifier (VGA)), a third amplifier component (e.g., another VGA), and/or one or more other amplifier components. The first amplifier component can receives an input signal, such as an input current signal (e.g., from a photodiode or other electronic component) and can generate a first voltage signal having a first voltage level that can be based at least in part on a first gain level associated with the first amplifier component. The second amplifier component can receive the first voltage signal from the first amplifier component, and can generate a second voltage signal having a second voltage level based at least in part on the first voltage level of the first voltage signal and a second gain level associated with the second amplifier component. The third amplifier component can receive the second voltage signal from the second amplifier component, and can generate a third voltage signal having a third voltage level based at least in part on the second voltage level of the second voltage signal and a third gain level associated with the third amplifier component. The system can provide an output signal that can be based at least in part on the third voltage signal. In some embodiments, the output signal can be provided to another device or system for further use or processing.

In certain embodiments, the system can further comprise an automatic gain control (AGC) component, and the output signal also can be provided to the AGC component, which can be part of an AGC or feedback loop of the system. The AGC component can control the respective gain levels of the respective amplifier components of the group of amplifier components based at least in part on the output signal, in accordance with an amplifier gain adjustment sequence that can facilitate alternating partial gain level adjustments (e.g., ping-pong gain staggering of gain levels) associated with the first amplifier component and the second amplifier component. To facilitate adjustment or partial adjustment of a gain level associated with the group of amplifier components, the AGC component can generate a control signal, and can provide the control signal to the desired amplifier component to facilitate adjusting (e.g., increasing or decreasing) or partially adjusting the gain level of the desired amplifier component, in accordance with the amplifier gain adjustment sequence.

In some embodiments, the AGC component can analyze the output signal, and, based at least in part on a result of analyzing the output signal, the AGC component can determine characteristics of the output signal (e.g., an amount of output voltage swing of the output signal or other characteristics of the output signal). The AGC component can determine a state value (e.g., an AGC state value) associated with the AGC component, based at least in part on the characteristics of the output signal, wherein the state value can be associated with (e.g., indicative or representative of) a state (e.g., an AGC state) associated with the AGC component. The AGC component can determine whether to adjust (e.g., increase or reduce) a gain level of an amplifier component of the group of amplifier components, and, if there is to be a gain level adjustment, which of the amplifier components is to have its gain level adjusted (e.g., partially adjusted), based at least in part on the state value and the amplifier gain adjustment sequence. In certain embodiments, the amplifier gain adjustment sequence can map or associate respective gain level adjustments to respective amplifier components (e.g., first, second, third, and/or other amplifier components) to or with respective state values and/or respective states associated with the AGC component.

In some instances, such as when the input signal is increasing or has increased in power, it can be desirable to reduce the overall gain level associated with the group of amplifier components. In such instances, the AGC component can reduce the gain level of the amplifier component of the group that is closest to the output of the system. For instance, if the third amplifier component is the closest amplifier component to the output of the system (or if the gain level(s) of another amplifier component(s) (e.g., fourth amplifier component) closest to the output of the system is at its minimum gain level), the AGC component can reduce the third gain level associated with the third amplifier component until the third amplifier component satisfies a defined gain level (e.g., meets, reaches, or is at the defined gain level, which can be a defined threshold minimum gain level or other desired defined gain level), in accordance with the amplifier gain adjustment sequence.

If, based on a result of analyzing the output signal (e.g., a next or subsequent output voltage signal), further gain reduction is determined to be desired (e.g., target, wanted, or necessary) to achieve a desired output voltage level of the output signal, the AGC component can determine which of the first gain level associated with the first amplifier component and the second gain level associated with the second amplifier component is to be partially reduced, in accordance with the amplifier gain adjustment sequence, wherein the amplifier gain adjustment sequence, in part, can specify or indicate alternating between partial first gain level reductions associated with the first amplifier component and partial second gain level reductions associated with the second amplifier component. For instance, the AGC component can determine a state value and/or state associated with the AGC component based at least in part on the result of analyzing such output signal. The AGC component can determine which of the first gain level associated with the first amplifier component and the second gain level associated with the second amplifier component is to be partially reduced, based at least in part on the amplifier gain adjustment sequence and the state value and/or state associated with the AGC component.

The AGC component can reduce either the first gain level associated with the first amplifier component by a first portion (e.g., a first portion or percentage of the first gain range associated with the first amplifier component) or the second gain level associated with the second amplifier component by a second portion (e.g., a second portion or percentage of the second gain range associated with the second amplifier component), depending on which of those gain levels is to be partially reduced, as determined by the AGC component in accordance with the amplifier gain adjustment sequence. If and to the extent that the AGC component determines that further reduction in the overall gain level associated with the group of amplifier components is desired to achieve the desired (e.g., target, wanted, or necessary) output signal, based on a result of analyzing another output signal (e.g., another next or subsequent output signal), the AGC component can alternate between first groups of partial reductions (e.g., each of one or more first groups comprising one or more partial reductions) of the first gain level associated with the first amplifier component and second groups of partial reductions (e.g., each of one or more second groups comprising one or more partial reductions) of the second gain level associated with the second amplifier component, in accordance with the amplifier gain adjustment sequence. For example, the AGC component can alternate by performing a second group of partial reductions of the second gain level associated with the second amplifier component (e.g., if the AGC component (or another component, such as a gain manager component associated therewith) determines that the alternating partial gain reductions are to begin with the second amplifier component), followed by a first group of partial reductions of the first gain level associated with the first amplifier component, followed by another second group of partial reductions of the second gain level associated with the second amplifier component, followed by another first group of partial reductions of the first gain level associated with the first amplifier component, and/or one or more other partial reductions in respective gain levels associated with those amplifier components, as desired to achieve the desired output signal.

When an increase in the overall gain level associated with the group of amplifier components is desired to achieve a desired output signal, the AGC component also can control respective increases in respective gain levels associated with the respective amplifier components of the group, in accordance with the amplifier gain adjustment sequence (e.g., based at least in part on a state value and/or state associated with the AGC component determined from analysis of the output signal, and the amplifier gain adjustment sequence). For instance, the AGC component can perform respective increases in the respective gain levels associated with the respective amplifier components, including alternating partial gain level increases associated with the first and second amplifier components, in an opposite order that gain level reductions can be or were performed, in accordance with the amplifier gain adjustment sequence, such as more fully described herein.

The AGC component, amplifier gain adjustment sequence, and techniques described herein, by employing alternating and partial adjustments of gain levels (e.g., ping-pong gain staggering) associated with amplifier components in accordance with a desired amplifier gain adjustment sequence, can provide enhanced (e.g., improved or optimized) performance of the systems and devices described herein, over existing systems, devices, and techniques relating to adjusting gain levels of amplifiers. The AGC component, amplifier gain adjustment sequence, and techniques described herein can provide for enhanced sensitivity (e.g., improved, increased, or optimized sensitivity), overload (e.g., improved, increased, or optimized overload), and/or BER floor (e.g., improved, lower, or optimized BER floor), and can achieve a desirable compromise between noise and linearity for amplifier components, including enabling a desirable reduction in noise at an acceptably small expense of some linearity associated with the amplifier components, as compared to existing techniques relating to adjusting gain levels of amplifiers. The AGC component, amplifier gain adjustment sequence, and techniques described herein also can desirably mitigate (e.g., reduce or minimize) peaking associated with the output signal, while also desirably mitigating (e.g., reducing or minimizing) compression of the output signal, and can generate an output signal that can have a desirably (e.g., suitably, enhancedly, or optimally) flat response (e.g., a maximally flat frequency response, or virtually, or substantially close to, a maximally flat frequency response), which can be improvements over existing techniques relating to adjusting gain levels of amplifiers.

These and other aspects and embodiments of the disclosed subject matter will now be described with respect to the drawings.

FIG. 1 illustrates a block diagram of a non-limiting example system 100 that can desirably (e.g., suitably, acceptably, enhancedly, or optimally) control adjustments to gain levels associated with amplifier components, in accordance with an amplifier gain adjustment sequence that can facilitate alternating partial gain level reductions associated with some of the amplifier components, in accordance with various aspects and embodiments of the disclosed subject matter. The system 100 can be part of, employed by, or associated with a device (e.g., an electrical or electronic device) that can perform desired electrical or electronic functions.

For example, a device can comprise amplifiers, transistors, capacitors, diodes, photodiodes, inductors, voltage supply component(s), optical electronic component(s), and/or other electrical or electronic components that can be respectively arranged and/or connected to form an electrical circuit that can perform desired electrical or electronic functions. For instance, an electrical circuit can employ an amplifier that can receive input signals (e.g., electronic or electrical signals) and can amplify or otherwise process the input signals to generate output signals, wherein the amplifier device can have a gain that can range from unity to a desired gain that can be greater than unity (e.g., one and a half times gain, two times gain, three times gain, four times gain, or other desired gain). An amplifier and/or other type of electrical or electronic component can be utilized in a variety of different types of electronic devices, such as, for example, a communication device (e.g., a phone, a mobile phone, a computer, a laptop computer, an electronic pad or tablet, a device that can provide high speed optical communications (e.g., which can be employed in datacenters or for other desired applications), a television, an Internet Protocol television (IPTV), a set-top box, an electronic gaming device, electronic eyeglasses with communication functionality, an electronic watch with communication functionality, other electronic bodywear with communication functionality, or Internet of Things (IoT) devices), optical-related or solar-related devices (e.g., solar cells, communication devices, communication network devices, or other type of electronic device that can employ optical electronic technology; lighting-related devices (e.g., light emitting diode (LED) devices, laser-related devices; optical-related memory device; or other type of lighting-related device that can employ optical electronic technology), or other type of optical-related or solar-related device), vehicle-related electronic devices, appliances (e.g., refrigerator, oven, microwave oven, washer, dryer, or other type of appliance), audio equipment (e.g., stereo system, radio system, or other type of audio equipment), musical equipment (e.g., electric or electronic musical instruments, instrument amplifier, audio signal processor, or other type of musical equipment), or other type of electronic device that can utilize an amplifier and/or other type of electrical or electronic component to facilitate operation of the electronic device. In some embodiments, the system 100 can be part of a receiver component (e.g., an optical receiver component) that can receive signals (e.g., optical or laser signals) from a transmitter component (e.g., an optical transmitter component) via a communication link (e.g., an optical fiber link).

The system 100 can comprise a group of amplifier components, which can include, for example, a first amplifier component ($1^{ST}$ AMP) 102, a second amplifier component ($2^{ND}$ AMP) 104, a third amplifier component ($3^{RD}$ AMP) 106, a fourth amplifier component ($4^{TH}$ AMP) 108, and/or one or more other amplifier components (not shown in FIG. 1 for reasons of brevity and clarity). In some embodiments, the system 100 also can comprise a diode 110 that can be associated with an input (e.g., input port) of the first amplifier component 102, wherein the diode can receive or detect a signal associated with the system 100. In certain embodiments, the diode 110 can be a photodiode that can receive or sense optical signals (e.g., optical or light energy) associated with the system 100, and can generate a current signal (e.g., input current signal) that can be received by the first amplifier component 102 (e.g., at its input port). In other embodiments, a different type of diode or a different type of electronic component can be employed in the system 100.

In some embodiments, the first amplifier component 102 can be a transimpedance amplifier (TIA) component that can receive an input current signal, and can convert the input current signal to a first voltage signal at a first voltage level based at least in part on a first gain level associated with the first amplifier component 102. The first amplifier component 102 can have a variable gain such that its gain level (e.g., first gain level) can be desirably (e.g., suitably, enhancedly, or optimally) varied or adjusted, as desired, from a first minimum gain level (e.g., a first threshold minimum gain level) to a first maximum gain level (e.g., a first threshold maximum gain level) based at least in part on a first gain range (e.g., range from minimum to maximum gain level) associated with the first amplifier component 102. In certain embodiments, the first amplifier component 102 can have a single-ended input and a single-ended output (e.g., single-ended output port). In other embodiments, the first amplifier component 102 can have a differential input and/or a differential output. For example, there can be some applications (e.g., coherent communications applications or other types of applications) where there can be a differential optical signal (e.g., differential optical signal from two photodiodes) that can generate a differential input current signal that can be input to the first amplifier component 102 (e.g., TIA component).

In some embodiments, the second amplifier component 104 can be a variable gain amplifier (VGA) component (e.g., $VGA_0$) that can have an input (e.g., input port) that can be associated with (e.g., electrically or electronically connected to) the output (e.g., output port) of the first amplifier component 102. The second amplifier component 104 can receive the first voltage signal at its input, and can generate a second voltage signal at a second voltage level that can be based at least in part on a second gain level associated with the second amplifier component 104 (e.g., based at least in part on the second gain level applied to the first voltage signal). The gain level (e.g., second gain level) of the second amplifier component 104 can be desirably (e.g., suitably, enhancedly, or optimally) varied or adjusted from a second minimum gain level (e.g., a second threshold minimum gain level) to a second maximum gain level (e.g., a second threshold maximum gain level) based at least in part on a second gain range associated with the second amplifier component 104. In certain embodiments, the second amplifier component 104 can have a single-ended input and a differential output (e.g., differential output port). In other embodiments, the second amplifier component can have a differential input and/or a differential output.

In some embodiments, the third amplifier component 106 can be another VGA component (e.g., $VGA_1$) that can have an input (e.g., input port) that can be associated with (e.g., electrically or electronically connected to) the output (e.g., output port) of the second amplifier component 104. The third amplifier component 106 can receive the second voltage signal at its input, and can generate a third voltage signal at a third voltage level that can be based at least in part on a third gain level associated with the third amplifier component 106 (e.g., based at least in part on the third gain level applied to the second voltage signal). The third gain level of the third amplifier component 106 can be varied or adjusted, as desired, from a third minimum gain level to a third maximum gain level based at least in part on a third gain range associated with the third amplifier component 106. In certain embodiments, the third amplifier component 106 can have a differential input (e.g., differential input port) and a differential output (e.g., differential output port).

In certain embodiments, the fourth amplifier component 108 can be still another VGA component (e.g., $VGA_n$, wherein n can be a desired number) that can have an input that can be associated with (e.g., electrically or electronically connected to) the output of the third amplifier component 106, although in other embodiments, there may be one or more other amplifier components that can be situated between the third amplifier component 106 and the fourth amplifier component 108 in the electronic circuitry of the system 100, wherein, in such other embodiments, the output of the third amplifier component 106 can be associated with an input of another amplifier component that can be adjacent to the third amplifier component 106, and wherein the input of the fourth amplifier component 108 can be associated with the output of another amplifier component that can be adjacent to the fourth amplifier component 108. In some embodiments, the fourth amplifier component 108 (e.g., when n=2, and it is $VGA_2$) can receive the third voltage signal at its input, and can generate a fourth voltage signal at a fourth voltage level that can be based at least in part on a fourth gain level associated with the fourth amplifier component 108 (e.g., based at least in part on the fourth gain level applied to the third voltage signal). The fourth gain level of the fourth amplifier component 108 can be varied or adjusted, as desired, from a fourth minimum gain level to a fourth maximum gain level based at least in part on a fourth gain range associated with the fourth amplifier component 108. In certain embodiments, the fourth amplifier component 108 can have a differential input and a differential output. It is to be appreciated and understood that, in some embodiments, the system 100 can contain less than four amplifier components, if desired.

In some embodiments, the system 100 can comprise a buffer component (BUFFER COMP) 112 that can receive the fourth voltage signal from the fourth amplifier component 108 (e.g., at an input port of the buffer component 112), and can generate or provide an output signal 114 (e.g., output voltage signal) as an output from the buffer component 112 (e.g., from an output port of the buffer component 112) that can be based at least in part on the fourth voltage signal (e.g., the output voltage level of the output signal can be, or can be a function of, the fourth voltage level of the fourth voltage signal). The output signal 114 also can be based at least in part on (e.g., can be a function of) the input current signal input to the first amplifier component 102. The output signal 114 can be provided to another desired component or system, can be provided to an automatic gain control (AGC) component 116 (e.g., as part of an AGC or feedback loop), and/or can otherwise be utilized, as desired.

In accordance with various embodiments, the AGC component 116 can control (e.g., automatically control, manage, or adjust) respective gain levels (e.g., the first gain level, second gain level, third gain level, fourth gain level, and/or one or more other gain levels) respectively associated with the respective amplifier components (e.g., first amplifier component 102, second amplifier component 104, third amplifier component 106, fourth amplifier component 108, and/or one or more other amplifier components) of the group of amplifier components, based at least in part on a result of analyzing the output signal 114, in accordance with an amplifier gain adjustment sequence that, in part, specifies or indicates alternating between partial first gain level adjustments (e.g., reductions or increases) associated with the first amplifier component 102 and partial second gain level adjustments (e.g., reductions or increases) associated with the second amplifier component 104. The amplifier gain adjustment sequence can facilitate reducing the overall gain level associated with the group of amplifier components, by individual adjustment (e.g., reductions) of individual gain levels of individual amplifier components (e.g., 102, 104, 106, and/or 108), in response to the output signal 114 indicating that the input current signal is increasing or has increased in power. The amplifier gain adjustment sequence also can facilitate increasing the overall gain level associated with the group of amplifier components, by individual adjustment (e.g., increases) of individual gain levels of individual amplifier components (e.g., 102, 104, 106, and/or 108), in response to the output signal 114 indicating that the input current signal is decreasing or has decreased in power.

In some embodiments, the AGC component 116 can analyze the output signal 114 (e.g., in relation or comparison to a reference signal), and, based at least in part on a result of analyzing the output signal 114, the AGC component 116 can determine characteristics of the output signal 114 (e.g., an amount of output voltage swing of the output signal 114, peak voltage value, received signal strength indicator (RSSI), or other characteristics of the output signal 114). The AGC component 116 can determine a state value (e.g., an AGC state value) associated with the AGC component 116, based at least in part on the characteristics of the output signal 114, wherein the state value can be associated with (e.g., indicative or representative of) a state (e.g., an AGC state) associated with the AGC component 116. The AGC component 116 can determine whether to adjust (e.g., increase or reduce) a gain level of an amplifier component (e.g., 102, 104, 106, or 108) of the group of amplifier components, and, if there is to be a gain level adjustment, which of the amplifier components (e.g., 102, 104, 106, or 108) is to have its gain level adjusted (e.g., partially adjusted), based at least in part on the state value and the amplifier gain adjustment sequence. In certain embodiments, the amplifier gain adjustment sequence can map or associate respective gain level adjustments to be applied to respective amplifier components (e.g., 102, 104, 106, and/or 108) to or with respective state values and/or respective states associated with the AGC component 116.

In certain embodiments, in the AGC circuitry of the AGC component 116, the AGC component 116 can comprise a peak detector whose function can be to detect the output swing of the output signal 114 that is output from the buffer component 112 (e.g., the output buffer). The output signal 114 can vary between a maximum and minimum voltage level. The difference between the maximum voltage level and the minimum voltage level can be defined as the swing of the output signal 114. The AGC component 116 can receive the output signal 114 or other signal information from the buffer component 112, and can analyze or process the output signal 114 or other signal information to determine or derive the characteristics associated with the output signal 114, including a peak voltage value or average voltage value of the output signal 114 (e.g., based at least in part on a peak envelope signal), the output voltage swing of the output signal 114, and/or other characteristics of the output signal 114. For instance, with regard to output voltage swing, the AGC component 116 can compare the peak voltage value to a reference voltage value of the reference signal to determine whether the output signal 114 is above, at, or below a desired (e.g., target, wanted, necessary, or optimal) magnitude, based at least in part on a result of the comparison of the peak voltage value to the reference voltage value, and/or based at least in part on another desired factor.

If, based at least in part on analysis of the output signal 114, the AGC component 116 determines that the output swing of the output signal 114 from the buffer component 112 is larger than a target output swing (e.g., from the reference signal), the AGC component 116 can reduce the gain (e.g., the overall gain) of the group of amplifier components (e.g., 102, 104, 106, and/or 108) by increasing the state associated with the AGC component 116. If, instead, based at least in part on analysis of the output signal 114, the AGC component 116 determines that the output swing of the output signal 114 is smaller or lower than the target output swing, the AGC component 116 can increase the gain by reducing the state associated with the AGC component 116. In some embodiments, state values associated with respective states (e.g., 32 AGC states or other desired number of AGC states) can range from 0 to 2016, where a state value=0 can result in maximum gain of the group of amplifier components and a state value=2016 can result in minimum gain of the group of amplifier components. In other embodiments the range of state values can have a different range than 0 to 2016. The state value associated with the AGC component 116 can be an indicator or a proxy (e.g., rough proxy) for the incoming input power of the input signal that is input to the group of amplifier components, as, for example, a state value=0 can indicate that there is very low or small input power, and a state value=2016 can indicate that there is very high or large input power. The AGC component 116 can utilize the target output swing as a reference (e.g., reference signal), and the target output swing can be defined through one or more register components (e.g., registers). For instance, the AGC component 116 can compare the output signal 114 to the target output signal to facilitate determining the state value and/or determining gain level adjustments for the group of amplifier components. The target output swing can be changed or set (e.g., dynamically changed or set) by a user, or by the system 100, another system, or device, at the time of manufacture or other desired time.

The amplifier gain adjustment sequence can be arranged or structured, as desired. In some embodiments, with regard to decreasing gain levels associated with the amplifier components (e.g., 102, 104, 106, and/or 108), the AGC component 116 can implement a first type amplifier gain adjustment sequence by initially decreasing the gain level associated with the last amplifier component before the buffer component 112 (e.g., the fourth gain level associated with the fourth amplifier component 108), as desired (e.g., as is suitable, wanted, or needed), up until the gain level satisfies a fourth defined gain level (e.g., meets, reaches, or is at the fourth defined gain level, which can be a fourth threshold minimum gain level or other desired fourth gain level, associated with the fourth amplifier component 108), to achieve or try to achieve a desired output signal 114 (e.g., output signal 114 having a desired output voltage level). In accordance with this first type amplifier gain adjustment sequence, if the AGC component 116 determines that further gain reduction is desired (e.g., suitable, wanted, or needed) after the fourth gain level reaches the fourth defined gain level to achieve or try to achieve the desired output signal 114, the AGC component 116 can decrease the third gain level associated with the third amplifier component 106 (e.g., decrease the gain level of the amplifier component adjacent to or associated with the last amplifier component), as desired, up until the third gain level reaches a third defined gain level associated with the third amplifier component 106 (e.g., meets, reaches, or is at the third defined gain level, which can be a third threshold minimum gain level or other desired third gain level, associated with the third amplifier component 106).

At this point, in accordance with this first type amplifier gain adjustment sequence, if the AGC component 116 determines that gain reduction (e.g., further gain reduction) is desired after the third gain level reaches the third defined gain level to achieve or try to achieve the desired output signal 114, the AGC component 116 can alternate between partially decreasing the second gain level (e.g., by a second portion of the second gain range) associated with the second amplifier component 104 and partially decreasing the first gain level (e.g., by a first portion of the first gain range) associated with the first amplifier component 102. For instance, in accordance with this first type amplifier gain adjustment sequence, and with regard to multiple partial gain reductions to be performed over a period of time (e.g., due to the AGC component 116 making multiple determinations that partial gain reduction is desired to achieve a desired output signal 114), the AGC component 116 can perform a second group of partial gain reductions (e.g., a second group comprising one or more partial gain reductions) to decrease the second gain level associated with the second amplifier component 104 by a second portion(s) of the second gain range (e.g., 12.5%, or other desired percentage or portion(s), of the second gain range) associated with the second amplifier component 104 in connection with one or more determinations that partial gain reduction is desired; if further (e.g., subsequent or following) gain reduction associated with the group of amplifier components is desired, the AGC component 116 can perform a first group of partial gain reductions (e.g., a first group comprising one or more partial gain reductions) to decrease the first gain level associated with the first amplifier component 102 by a first portion(s) of the first gain range (e.g., 12.5%, or other desired percentage or portion(s), of the first gain range) associated with the first amplifier component 102 in connection with one or more determinations that partial gain reduction is desired; if even further gain reduction associated with the group of amplifier components is desired, the AGC component 116 can perform another second group of partial gain reductions (e.g., another second group comprising one or more partial gain reductions) to decrease the second gain level associated with the second amplifier component 104 by another second portion(s) of the second gain range (e.g., another 12.5%, or other desired percentage or portion(s), of the second gain range) associated with the second amplifier component 104 in connection with one or more determinations that further partial gain reduction is desired; if still further gain reduction associated with the group of amplifier components is desired, the AGC component 116 can perform another first group of partial gain reductions (e.g., another first group comprising one or more partial gain reductions) to decrease the first gain level associated with the first amplifier component 102 by another first portion(s) of the first gain range (e.g., 12.5%, or other desired percentage or portion(s), of the first gain range) associated with the first amplifier component 102 in connection with one or more determinations that further partial gain reduction is desired; and/or, if even further gain reduction associated with the group of amplifier components is desired, the AGC component 116 can alternate between performing one or more partial reductions of the second gain level associated with the second amplifier component 104 and/or the first gain level associated with the first amplifier component 102 in connection with one or more determinations that further partial gain reduction is desired.

As a non-limiting example, TABLE 1 can provide an example amplifier gain adjustment sequence that can indicate example respective gain level adjustments for respective amplifier components (e.g., 102, 104, 106, 108), including alternating partial gain level adjustments for the first amplifier component 102 (e.g., TIA component) and second amplifier component 104 (e.g., first VGA), as a function of respective threshold AGC state values and associated respective AGC states, in accordance with the example amplifier gain adjustment sequence. In this example, the first amplifier component 102 can be TIA, the second amplifier component 104 can be $VGA_0$, the third amplifier component 106 can be $VGA_1$, and the fourth amplifier component 108 can be $VGA_2$. In this example, there can be 32 AGC states ranging from 0 to 31, and AGC state values can range from 0 to 2016, with threshold AGC state values in increments of 63, wherein respective subgroups of AGC state values can be associated with respective AGC states (e.g., AGC state 0 can be associated with a subgroup of AGC state values ranging from 0 to 62; AGC state 1 can be associated with a subgroup of AGC state values ranging from 63 to 125; AGC state 2 can be associated with a subgroup of AGC state values ranging from 126 to 188; and/or other respective AGC states can be associated with other respective subgroups of AGC state values).

TABLE 1

Example Amplifier Gain Adjustment Sequence For Example Amplifier Gain Adjustments As A Function Of A Threshold AGC State Value And An Associated AGC State

| AGC State | Threshold AGC State Value | Gain Adjustment |
|---|---|---|
| 0 | 0 | — |
| 1 | 63 | $1^{st}$ portion of gain of $VGA_2$ |
| 2 | 126 | $2^{nd}$ portion of gain of $VGA_2$ |
| 3 | 189 | $3^{rd}$ portion of gain of $VGA_2$ |
| ... | ... | ... |
| 8 | 504 | $8^{th}$ and final portion of gain of $VGA_2$ |
| 9 | 567 | $1^{st}$ portion of gain of $VGA_1$ |
| 10 | 630 | $2^{nd}$ portion of gain of $VGA_1$ |
| ... | ... | ... |
| 16 | 1008 | $8^{th}$ and final portion of gain of $VGA_1$ |
| 17 | 1071 | $1^{st}$ portion of gain of $VGA_0$ |
| 18 | 1134 | $2^{nd}$ portion of gain of $VGA_0$ |
| 19 | 1197 | $1^{st}$ portion of gain of TIA |
| 20 | 1260 | $2^{nd}$ portion of gain of TIA |
| 21 | 1323 | $3^{rd}$ portion of gain of $VGA_0$ |
| ... | ... | ... |
| 29 | 1827 | $8^{th}$ and final portion of gain of $VGA_0$ |
| 30 | 1890 | $7^{th}$ portion of gain of TIA |
| 31 | 1953 | $8^{th}$ and final portion of gain of TIA |

Generally, as the AGC state value increases, and accordingly, the AGC state increases, this can indicate that the input power of the input signal can be increasing, and, as a result, reduction of the gain level of an amplifier component (e.g., 102, 104, 106, or 108) can be desired; and as the AGC state value decreases, and accordingly, the AGC state decreases, this can indicate that the input power of the input signal can be decreasing, and, as a result, an increase of the gain level of an amplifier component (e.g., 102, 104, 106, or 108) can be desired. As presented in the example TABLE 1, with regard to adjustments (e.g., reductions) in gain, the AGC component 116 can reduce the gain level of the fourth amplifier component 108 (e.g., $VGA_1$) in respective portions as the AGC state value increases from 0 to 504 and satisfies (e.g., at least reaches or meets) respective threshold AGC state values (e.g., threshold AGC state values 63, 126, 189, . . . , 504) associated with the respective AGC states (e.g., AGC states 1, 2, 3, . . . , 8), and can reduce the gain level of the third amplifier component 106 (e.g., $VGA_0$) in respective portions as the AGC state value increases from 567 to 1008 and satisfies (e.g., at least reaches or meets) the respective threshold AGC state values (e.g., threshold AGC state values 567, 630, . . . 1008) associated with the respective AGC states (e.g., AGC states 9, 10, . . . , 16). Thereafter, if and as the AGC value increases beyond 1008, the AGC component 116 can alternate between performing partial reductions of the gain levels of the second amplifier component 104 (e.g., $VGA_0$) and the first amplifier component 102 (e.g., TIA), in accordance with this example amplifier gain adjustment sequence exemplified in TABLE 1.

For instance, if, based at least in part on the result of analyzing the output signal 114, the AGC component 116 determines that the AGC value satisfies (e.g., meets or exceeds) the threshold AGC state value of 1071 (and is less than 1134) associated with AGC state 17, the AGC component 116 can reduce the gain level of the second amplifier component 104 (e.g., $VGA_O$) by a first portion. If, based at least in part on the result of analyzing another output signal 114, the AGC component 116 determines that the AGC value satisfies (e.g., meets or exceeds) the threshold AGC state value of 1134 (and is less than 1197) associated with AGC state 18, the AGC component 116 can reduce the gain level of the second amplifier component 104 (e.g., $VGA_O$) by a second portion. Thereafter, if, based at least in part on the result of analyzing still another output signal 114, the AGC component 116 determines that the AGC value satisfies (e.g., meets or exceeds) the threshold AGC state value of 1197 (and is less than 1260) associated with AGC state 19, the AGC component 116 can alternate to reduce the gain level of the first amplifier component 102 (e.g., TIA) by a first portion, even though the gain level of the second amplifier component 104 (e.g., $VGA_O$) has not yet been reduced to the second defined gain level (e.g., second threshold minimum gain level or other desired lower gain level associated with the second amplifier component 104).

Thereafter, if, based at least in part on the result of analyzing yet another output signal 114, the AGC component 116 determines that the AGC value satisfies (e.g., meets or exceeds) the threshold AGC state value of 1260 (and is less than 1323) associated with AGC state 20, the AGC component 116 can reduce the gain level of the first amplifier component 102 (e.g., TIA) by a second portion. Thereafter, if, based at least in part on the result of analyzing still another output signal 114, the AGC component 116 determines that the AGC value satisfies (e.g., meets or exceeds) the threshold AGC state value of 1323 (and is less than 1386) associated with AGC state 21, the AGC component 116 can alternate to reduce the gain level of the second amplifier component 104 (e.g., $VGA_O$) by a third portion, even though the gain level of the first amplifier component 102 (e.g., TIA) has not yet been reduced to the first defined gain level (e.g., first threshold minimum gain level or other desired lower gain level associated with the first amplifier component 102). If and as the AGC value increases further, the AGC component 116 can continue to alternate between partial reduction of respective gain levels of the second amplifier component 104 (e.g., $VGA_O$) and the first amplifier component 102 (e.g., TIA) by respective portions of gain level reduction, in accordance with this example amplifier gain adjustment sequence exemplified in TABLE 1.

It is to be appreciated and understood that the example amplifier gain adjustment sequence exemplified in TABLE 1 is but one example amplifier gain adjustment sequence that can be utilized or executed by the AGC component 116, and, in accordance with other embodiments, the AGC component 116 can employ one or more different amplifier gain adjustment sequences that can include alternating between partial reductions of gain levels of the second amplifier component 104 (e.g., $VGA_O$) and the first amplifier component 102 (e.g., TIA) in a different manner than exemplified in TABLE 1, including, but not limited to, other non-limiting example amplifier gain adjustment sequences described herein. Also, in accordance with various embodiments, the number of AGC states, the threshold AGC state values associated with performing of gain level adjustments, the number of portions of gain level adjustments associated with each amplifier component, the number of portions of gain level adjustments associated with one amplifier component (e.g., second amplifier component 104) before alternating to a gain level adjustment associated with another amplifier component (e.g., first amplifier component 102), and/or other characteristics of an amplifier gain adjustment sequence can be structured, selected, or utilized to create (e.g., generate) a desired amplifier gain adjustment sequence, which can be implemented or executed by the AGC component 116.

In some embodiments, the AGC component 116 and/or other component of the system 100 can comprise or be associated with logic (e.g., hardware logic) and circuitry that can be representative of and/or can implement the amplifier gain adjustment sequence, including the respective adjustments of gain levels of amplifier components in relation to (e.g., as a function of) respective AGC state values and/or AGC states. Values in a look-up table (e.g., TABLE 1 or other table) representative of the amplifier gain adjustment sequence and/or other desired values (e.g., threshold values, system settings, or other values) associated with the AGC component 116 can be stored in register components or other memory. In other embodiments, the AGC component 116 and/or other component of the system 100 can comprise or be associated with logic (e.g., hardware and/or software logic) and circuitry that can be representative of and/or can implement the amplifier gain adjustment sequence, which can include implementation and use (e.g., by the AGC component 116) of the look-up table (e.g., TABLE 1 or other table) or mapping comprising the respective adjustments of gain levels of amplifier components in relation to (e.g., as a function of) respective AGC state values and/or AGC states that can be stored in a data store (e.g., memory) or register components, such as described herein.

With regard to increasing the overall gain level associated with the group of components, if and when desired to achieve a desired output signal 114 (e.g., due to a decreased or decreasing input current level input to the first amplifier component 102), the AGC component 116 can implement the first type of amplifier gain adjustment sequence (or other applicable amplifier gain adjustment sequence) in the reverse order than was implemented to facilitate decreasing the overall gain level associated with the group of amplifier components (e.g., 102, 104, 106, and/or 108). For instance, if the first gain level associated with the first amplifier component 102 is below the first maximum gain level associated with the first amplifier component 102 and/or the second gain level associated with the second amplifier component 104 is below the second maximum gain level associated with the second amplifier component 104, the AGC component 116 can alternate between increasing the first gain level associated with the first amplifier component 102 by a first portion(s) (e.g., a first group of portions comprising one or more portions), and increasing the second gain level associated with the second amplifier component 104 by a second portion(s) (e.g., a second group of portions comprising one or more portions) up until the first gain level satisfies (e.g., reaches or meets) the first maximum gain level (or other desired first defined gain level) and the second gain level satisfies the second maximum gain level (or other desired second defined gain level) (e.g., if the overall gain level associated with the group of amplifier components has to be increased to reach the first maximum gain level (or other desired first defined gain level) and the second maximum gain level (or other desired second defined gain level) in order to achieve, or proceed toward achieving, the desired output signal 114). In some embodiments, the AGC component 116 can begin such increasing of gain level by partially increasing the first gain level associated with the first amplifier component 102 if that was the last one to be reduced, or by partially increasing the second gain level associated with the second amplifier component 104 if that was the last one to be reduced.

In some embodiments, the threshold AGC state values utilized by the AGC component 116 to determine whether to increase a gain level of an amplifier component (e.g., 102, 104, 106, or 108) can be the same threshold AGC state values utilized by the AGC component 116 to determine whether to decrease a gain level of an amplifier component. In certain other embodiments, the threshold AGC state values utilized by the AGC component 116 to determine whether to increase a gain level of an amplifier component (e.g., 102, 104, 106, or 108) can be different threshold AGC state values that the threshold AGC state values utilized by the AGC component 116 to determine whether to decrease a gain level of an amplifier component. For example, with regard to gain reduction, a threshold AGC state value of 1071 can be utilized as a threshold or transition point for transitioning from up from AGC state 16 to AGC state 17, where AGC state 17 can correspond to a partial reduction of the gain level of the second amplifier component 104 (e.g., $VGA_0$) by a first portion. However, with regard to gain increase, instead of using a threshold AGC state value of 1071 as a threshold or transition point for transitioning down from AGC state 17 to AGC state 16, the amplifier gain adjustment sequence can utilize a threshold AGC state value of 1041 (or other desired AGC state value less than 1071 and greater than 1008) as a threshold or transition point for transitioning down from AGC state 17 to AGC state 16, where AGC state 16 can correspond to a partial increase of the gain level of the second amplifier component 104 (e.g., $VGA_0$) by a first portion.

In other embodiments, instead of utilizing the first type amplifier gain adjustment sequence, the AGC component 116 can implement a second type amplifier gain adjustment sequence to facilitate decreasing or increasing gain levels associated with the amplifier components (e.g., 102, 104, 106, and/or 108). The second type amplifier gain adjustment sequence also can comprise alternating partial adjustments (e.g., reductions or increases by respective portions) of the first gain level associated with the first amplifier component 102 and the second gain level associated with the second amplifier component 104, which can be similar to the first type amplifier gain adjustment sequence, except, with regard to the second type amplifier gain adjustment sequence, the AGC component 116 can perform a first group of partial gain adjustments (e.g., a first group comprising one or more partial gain adjustments) of the first gain level associated with the first amplifier component 102 before performing a second group of partial gain adjustments (e.g., a second group comprising one or more partial gain adjustments) of the second gain level associated with the second amplifier component 104, and can continue alternating partial gain adjustments associated with the first amplifier component 102 and the second amplifier component 104 thereafter, if and as desired (e.g., wanted, necessary, or otherwise desired), based at least in part on AGC state values.

In accordance with still other embodiments, the AGC component 116 can implement still another type of amplifier gain adjustment sequence to facilitate decreasing or increasing gain levels associated with the amplifier components (e.g., 102, 104, 106, and/or 108) that can comprise alternating partial adjustments (e.g., reductions or increases by respective portions) of the first gain level associated with the first amplifier component 102 and the second gain level associated with the second amplifier component 104 in a different manner (e.g., different sequencing of respective partial gain adjustments of respective gains of the respective amplifier components (e.g., 102, 104)) than the first type of amplifier gain adjustment sequence and the second type of amplifier gain adjustment sequence.

Figure 2:
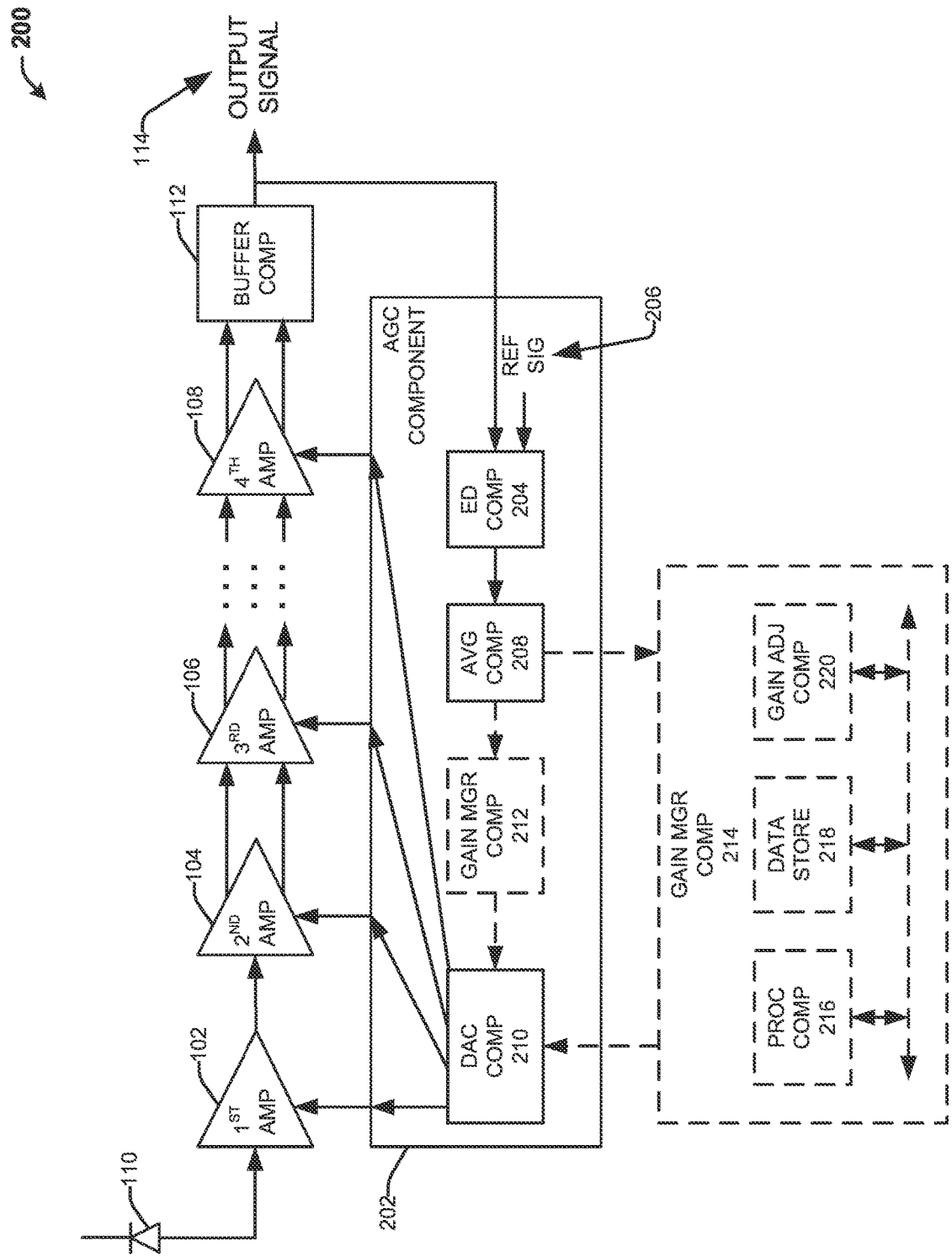
FIG. 2 depicts a block diagram of a non-limiting example system that can employ an AGC component and an associated gain manager component to desirably control adjustments to gain levels associated with amplifier components, in accordance with an amplifier gain adjustment sequence that can facilitate alternating partial gain level reductions associated with some of the amplifier components, in accordance with various aspects and embodiments of the disclosed subject matter.

Referring to FIG. 2, FIG. 2 depicts a block diagram of a non-limiting example system 200 that can employ an AGC component and an associated gain manager component to desirably (e.g., suitably, acceptably, enhancedly, or optimally) control adjustments to gain levels associated with amplifier components, in accordance with an amplifier gain adjustment sequence that can facilitate alternating partial gain level reductions associated with some of the amplifier components, in accordance with various aspects and embodiments of the disclosed subject matter. The system 200 can be part of, employed by, or associated with a device that can perform desired electrical or electronic functions.

The system 200 can comprise a group of amplifier components, which can include, for example, the first amplifier component 102, the second amplifier component 104, the third amplifier component 106, the fourth amplifier component 108, and/or one or more other amplifier components (not shown in FIG. 2 for reasons of brevity and clarity). In some embodiments, the system 200 also can comprise the diode 110 (e.g., photodiode) that can be associated with the input of the first amplifier component 102, wherein the diode can receive or detect a signal (e.g., optical signal) associated with the system 200, and can generate a current signal (e.g., input current signal) that can be received by the first amplifier component 102.

In some embodiments, the system 200 can comprise the buffer component 112 that can receive the fourth voltage signal from the fourth amplifier component 108, and can generate or provide the output signal 114 (e.g., output voltage signal) as an output from the buffer component 112 that can be based at least in part on the fourth voltage signal (e.g., the output voltage level of the output signal can be, or can be a function of, the fourth voltage level of the fourth voltage signal). The output signal 114 also can be based at least in part on (e.g., can be a function of) the input current signal input to the first amplifier component 102 and/or the respective gain levels associated with the respective amplifier components (e.g., 102, 104, 106, and/or 108). The output signal 114 can be provided to another desired component or system, can be provided to a AGC component 202 (e.g., as part of an AGC or feedback loop), and/or can otherwise be utilized, as desired.

In certain embodiments, the AGC component 202 can comprise an error detector component (ED COMP) 204 that can receive the output signal 114 that can be output from the buffer component 112. The error detector component 204 can compare the output signal 114 with a reference signal (REF SIG) 206, and can generate an error detection output signal (e.g., on a regular or continuous basis) based at least in part on the result of the comparison of the output signal 114 to the reference signal 206. For instance, the error detector component 204 can compare the output signal 114 with the reference signal 206, and can determine a difference between the output voltage level (e.g., peak voltage level or other determined or identified voltage level) of the output signal 114 and the reference voltage level of the reference signal 206, and can generate the error detection output signal as being equal to, or as a function of, the difference the output voltage level of the output signal 114 and the reference voltage level of the reference signal 206.

The AGC component 202 also can comprise an averaging component (AVG COMP) 208 that can comprise components and circuitry that can receive the error detection signals output from the error detector component 204, and can determine and generate an error voltage signal (e.g., error signal) that can be, or can be representative of, an average or median value, or other desired representative value or level, of the error detection signals (e.g., a portion of the error detection signals being evaluated by the averaging component 208). In some embodiments, if the error signal indicates that the output swing of the output signal 114 can be higher than the target output swing, this can indicate that the AGC state value determined by the AGC component 202 is to be relatively higher or increased, which can correspond to or indicate that the overall gain level associated with the group of amplifier components (e.g., 102, 104, 106, and/or 108) is to be reduced. If the error signal indicates that the output swing of the output signal 114 can be lower than the target output swing, this can indicate that the AGC state value determined by the AGC component 202 is to be relatively lower or reduced, which can correspond to or indicate that the overall gain level associated with the group of amplifier components (e.g., 102, 104, 106, and/or 108) is to be increased.

In some embodiments, the AGC component 202 can comprise a digital-to-analog-converter (DAC) component (DAC COMP) 210 that can comprise a group of DAC sub-components that can be utilized to facilitate controlling and/or adjusting (e.g., increasing or decreasing) the respective gain levels associated with the respective amplifier components (e.g., 102, 104, 106, and/or 108) of the system 200, based at least in part on the error voltage signal, in accordance with the amplifier gain adjustment sequence. The respective DAC sub-components of the DAC component 210 can be associated with (e.g., electronically connected to) the respective amplifier components (e.g., 102, 104, 106, and/or 108).

In accordance with various embodiments, the AGC component 202 can comprise (e.g., optionally can comprise) a gain manager component (GAIN MGR COMP) 212, or can comprise or be associated with (e.g., optionally can comprise or be associated with) a gain manager component 214, that can facilitate controlling respective adjustments to the respective gain levels of the respective amplifier components (e.g., 102, 104, 106, and/or 108), in accordance with the amplifier gain adjustment sequence. The gain manager component 212 can comprise sub-components (e.g., electronic or hardware components) that can implement electronic circuit logic that can correspond to, or can be representative of, the amplifier gain adjustment sequence to facilitate implementing the amplifier gain adjustment sequence. The gain manager component 212, employing the electronic circuit logic, can determine whether the overall gain level associated with the group of amplifier components is to be increased, be decreased, or remain the same, based at least in part on the error voltage signals received from the averaging component 208. If it is determined that the overall gain level associated with the group of amplifier components is to be adjusted (e.g., increased or decreased), the gain manager component 212, employing the electronic circuit logic, can determine which amplifier component (e.g., 102, 104, 106, or 108) of the group is to have its gain level adjusted, or partially adjusted (e.g., in the case of alternating partial gain level adjustments associated with the first amplifier component 102 or the second amplifier component 104), in accordance with the amplifier gain adjustment sequence.

In response to determining that a particular amplifier component (e.g., 102, 104, 106, or 108) is to have its gain level adjusted or partially adjusted, the gain manager component 212 can generate a control signal that corresponds to the particular amplifier component that is to have its gain level adjusted or partially adjusted and/or corresponds to the amount of the gain level adjustment, in accordance with the amplifier gain adjustment sequence. The gain manager component 212 can transmit the control signal to the DAC component 210, and the DAC component 210 can control the respective DAC sub-components, based at least in part on the control signal, to have a DAC sub-component associated with the particular amplifier component adjust or facilitate adjustment of the gain level associated with the particular amplifier component (e.g., the DAC sub-component can adjust or facilitate adjustment of a variable resistor of or associated with the particular amplifier component to adjust or partially adjust the gain level associated with the particular amplifier component).

For example, if the gain manager component 212 determines that the first gain level associated with the first amplifier component 102 is to be partially adjusted, in accordance with the amplifier gain adjustment sequence, the gain manager component 212 can communicate a control signal, which can indicate that the first gain level associated with the first amplifier component 102 is to be partially adjusted, to the DAC component 210. Based at least in part on the control signal, the DAC component 210 can control the DAC sub-component associated with the first amplifier component 102 to have the first gain level partially adjusted.

With further regard to the gain manager component 214, in some embodiments, if the system 200 employs (e.g., optionally employs) the gain manager component 214, the gain manager component 214 can be associated with the averaging component 208 and DAC component 210. The gain manager component 214 can utilize a processor component (PROC COMP) 216, such as, for example, a microcontroller, microprocessor, or processor, that can perform desired functions to facilitate controlling respective adjustments to the respective gain levels associated with the respective amplifier components (e.g., 102, 104, 106, and/or 108), in accordance with the amplifier gain adjustment sequence. The gain manager component 214 also can comprise a data store 218 that can store information relating to controlling the respective gain levels associated with the respective amplifier components (e.g., 102, 104, 106, and/or 108), wherein the information can include sequence information comprising or relating to the amplifier gain adjustment sequence. The gain manager component 214 also can comprise a gain adjuster component 220 that can operate in conjunction with the processor component 216 to determine whether the overall gain level associated with the group of amplifier components is to be increased, be decreased, or remain the same, based at least in part on a result of analyzing the error voltage signals received from the averaging component 208. If it is determined that the overall gain level associated with the group of amplifier components is to be adjusted (e.g., increased or decreased), the gain adjuster component (GAIN ADJ COMP) 220 and/or processor component 216 can determine which amplifier component (e.g., 102, 104, 106, or 108) of the group is to have its gain level adjusted, or partially adjusted (e.g., in the case of alternating partial gain level adjustments associated with the first amplifier component 102 or the second amplifier component 104), in accordance with the amplifier gain adjustment sequence.

In response to determining that a particular amplifier component (e.g., 102, 104, 106, or 108) is to have its gain level adjusted or partially adjusted, the gain adjuster component 220 and/or processor component 216 can generate a control signal that can correspond to the particular amplifier component that is to have its gain level adjusted or partially adjusted and/or correspond to the amount of the gain level adjustment, in accordance with the amplifier gain adjustment sequence. The gain manager component 214 can transmit the control signal to the DAC component 210, and the DAC component 210 can control the respective DAC sub-components, based at least in part on the control signal, to have a DAC sub-component associated with the particular amplifier component adjust or facilitate adjustment of the gain level associated with the particular amplifier component (e.g., the DAC sub-component can adjust or facilitate adjustment of a variable resistor of or associated with the particular amplifier component to adjust or partially adjust the gain level associated with the particular amplifier component).

In some embodiments, if and as desired, the gain manager component 212 or the gain manager component 214 can be updated or modified to modify (e.g., change, alter, or adjust) the amplifier gain adjustment sequence to change the ordering of performing adjustments to gain levels of amplifier components (e.g., 102, 104, 106, and/or 108), modify the amount or percentage of partial gain level adjustment that is to be made to the first gain level associated with the first amplifier component 102 and/or the second gain level associated with the second amplifier component 104, and/or to make another desired modification to the amplifier gain adjustment sequence to generate a modified amplifier gain adjustment sequence. The gain manager component 212 or the gain manager component 214, as modified, can control respective adjustments to the respective gain levels associated with the respective amplifier components (e.g., 102, 104, 106, and/or 108), in accordance with the modified amplifier gain adjustment sequence.

For example, if an amplifier gain adjustment sequence comprises partially reducing the first gain level (e.g., by performing a first group of partial reductions of the first gain level, comprising one or more partial reductions) associated with the first amplifier component 102 first after the third defined gain level (e.g., the third threshold minimum gain level or other desired third defined gain level) associated with the third amplifier component 106 has been satisfied (e.g., met, reached, or attained), and partially reducing the second gain level (e.g., by performing a second group of partial reductions of the second gain level, comprising one or more partial reductions) associated with the second amplifier component 104 after the first gain level associated with the first amplifier component 102 has been partially reduced (if such partial reduction of the second gain level is even desired, wanted, or necessary), if and as desired, the amplifier gain adjustment sequence can be modified to, instead, partially reduce the second gain level (e.g., by performing the second group of partial reductions of the second gain level) associated with the second amplifier component 104 first after the third defined gain level associated with the third amplifier component 106 has been satisfied, and partially reduce the first gain level (e.g., by performing the first group of partial reductions of the first gain level) associated with the first amplifier component 102 after the second gain level associated with the second amplifier component 104 has been partially reduced. As another example, if an amplifier gain adjustment sequence comprises partially reducing the first gain level associated with the first amplifier component 102 by 12.5% of the first gain range associated with the first amplifier component 102 when there is to be a partial reduction of the first gain level, and/or partially reducing the second gain level associated with the second amplifier component 104 by 12.5% of the second gain range associated with the second amplifier component 104 when there is to be a partial reduction of the second gain level, if and as desired, the amplifier gain adjustment sequence can be modified to, instead, partially reduce the first gain level associated with the first amplifier component 102 by an amount or percentage that is less than or greater than 12.5% of the first gain range associated with the first amplifier component 102 when there is to be a partial reduction of the first gain level, and/or partially reduce the second gain level associated with the second amplifier component 104 by an amount or percentage that is less than or greater than 12.5% of the second gain range associated with the second amplifier component 104 when there is to be a partial reduction of the second gain level. In certain embodiments, the amount of or percentage of partial gain adjustment associated with the first amplifier component 102 can be the same as or different from the amount of or percentage of partial gain adjustment associated with the second amplifier component 104.

With further regard to the processor component 216 and data store 218, the processor component 216 can work in conjunction with the other components (e.g., the data store 218, the gain adjuster component 220, or another component) to facilitate performing the various functions of the gain manager component 214. The processor component 216 can employ one or more processors, microprocessors, controllers, or microcontrollers that can process data, such as information relating to input signals, output signals, amplifiers, gain levels, gain adjustments, partial gain adjustments, threshold gain levels, resistor values, resistor value adjustments, amplifier gain adjustment sequences, tables relating to gain adjustments, signal paths, AGC or feedback loops, gain adjustment algorithms (e.g., ping-pong gain staggering algorithms), signal or traffic flows, policies, protocols, interfaces, tools, and/or other information, to facilitate operation of the gain manager component 214, as more fully disclosed herein, and control data flow between the gain manager component 214 and other components (e.g., AGC component, averaging component, or other component) associated with (e.g., connected to) the gain manager component 214.

The data store 218 can store data structures (e.g., user data, metadata), code structure(s) (e.g., modules, objects, hashes, classes, procedures) or instructions, information relating to input signals, output signals, amplifiers, gain levels, gain adjustments, partial gain adjustments, threshold gain levels, resistor values, resistor value adjustments, amplifier gain adjustment sequences, tables relating to gain adjustments, signal paths, AGC or feedback loops, gain adjustment algorithms (e.g., ping-pong gain staggering algorithms), signal or traffic flows, policies, protocols, interfaces, tools, and/or other information, to facilitate controlling operations associated with the gain manager component 214. In an aspect, the processor component 216 can be functionally coupled (e.g., through a memory bus) to the data store 218 in order to store and retrieve information desired to operate and/or confer functionality, at least in part, to the data store 218, the gain adjuster component 220, or other component, and/or substantially any other operational aspects of the gain manager component 214.

The data store 218 described herein can comprise volatile memory and/or nonvolatile memory, such as described herein. By way of example and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which can act as external cache memory. By way of example and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the disclosed aspects are intended to comprise, without being limited to, these and other suitable types of memory.

The AGC components, gain manager components, amplifier gain adjustment sequences, and techniques described herein, by employing alternating and partial adjustments of gain levels (e.g., ping-pong gain staggering) associated with amplifier components in accordance with a desired amplifier gain adjustment sequence and other techniques described herein, can provide enhanced (e.g., improved or optimized) performance of the systems and devices described herein, over existing systems, devices, and techniques relating to adjusting gain levels of amplifiers. The AGC components, gain manager components, amplifier gain adjustment sequences, and techniques described herein can provide for enhanced sensitivity (e.g., improved, increased, or optimized), overload, and/or BER floor (e.g., a lower or otherwise improved BER floor), and can achieve a desirable compromise between noise and linearity for amplifier components, including enabling a desirable reduction in noise at an acceptably small expense of some linearity associated with the amplifier components, as compared to existing techniques relating to adjusting gain levels of amplifiers. The AGC components, gain manager components, amplifier gain adjustment sequences, and techniques described herein also can desirably mitigate (e.g., reduce or minimize) peaking associated with the output signal, while also desirably mitigating (e.g., reducing or minimizing) compression of the output signal, and can generate an output signal that can have a desirably (e.g., suitably, enhancedly, or optimally) flat response (e.g., a maximally flat frequency response, or virtually, or substantially close to, a maximally flat frequency response), which can be improvements over existing techniques relating to adjusting gain levels of amplifiers.

In some embodiments, components (e.g., diode component, amplifier components, buffer component, AGC component, and/or other component(s)) of a system of the systems (e.g., system 100, system 200, or other system) described herein can be formed on a single integrated circuit (IC) chip or die. In other embodiments, respective components of a system of the systems described herein can be formed on respective IC chips or dies.

Figure 3:
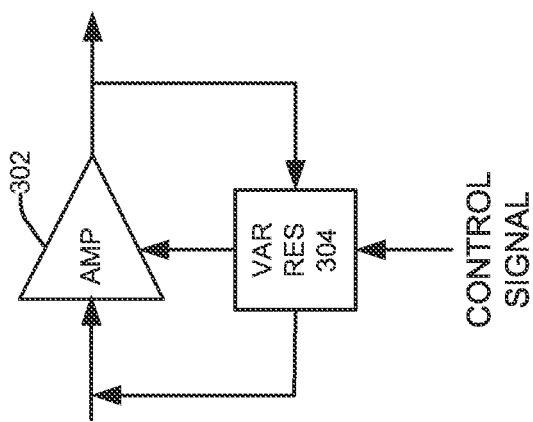
FIG. 3 illustrates a block diagram of a non-limiting example amplifier component that can a variable gain level, in accordance with various aspects and embodiments of the disclosed subject matter.

Referring briefly to FIG. 3, FIG. 3 illustrates a block diagram of a non-limiting example amplifier component 300 that can a variable gain level, in accordance with various aspects and embodiments of the disclosed subject matter. The amplifier component 300 can be, for example, a TIA amplifier component that can have a variable gain or a VGA amplifier component. In accordance with various embodiments, the amplifier component 300 can comprise a single-ended input or a differential input, and/or can comprise a single-ended output or a differential output (although, for reasons of brevity and clarity, the amplifier component 300 is depicted with a single-ended input and single-ended output). The amplifier component 300 can comprise an amplifier (AMP) 302 (e.g., an operational amplifier (op-amp) or other amplifier) that can modify or amplify electrical signals received at the input of the amplifier 302 to generate a modified or amplified electrical signal as an output from the amplifier 302.

The amplifier component 300 also can include a variable resistor component (VAR RES) 304 that, can be associated with the output and input of the amplifier 302, as part of a feedback loop associated with the amplifier 302. The gain level of the amplifier component 300 can be varied based at least in part on the varied amount of resistance of the variable resistor component 304. The amount of resistance of the variable resistor component 304 can be desirably varied between a maximum amount of resistance and a minimum amount of resistance based at least in part on a control signal received from the AGC component (e.g., a control signal received from the DAC component 210 of the AGC component 202). In some embodiments, the variable resistor component 304 can comprise one or more resistors having a desired resistance value(s) and/or logic and circuitry, such as complementary metal-oxide-semiconductor (CMOS) logic and circuitry, wherein the logic and circuitry can facilitate varying or adjusting the amount of resistance of the variable resistor component 304, based at least in part on the control signal received from the AGC component.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 4:
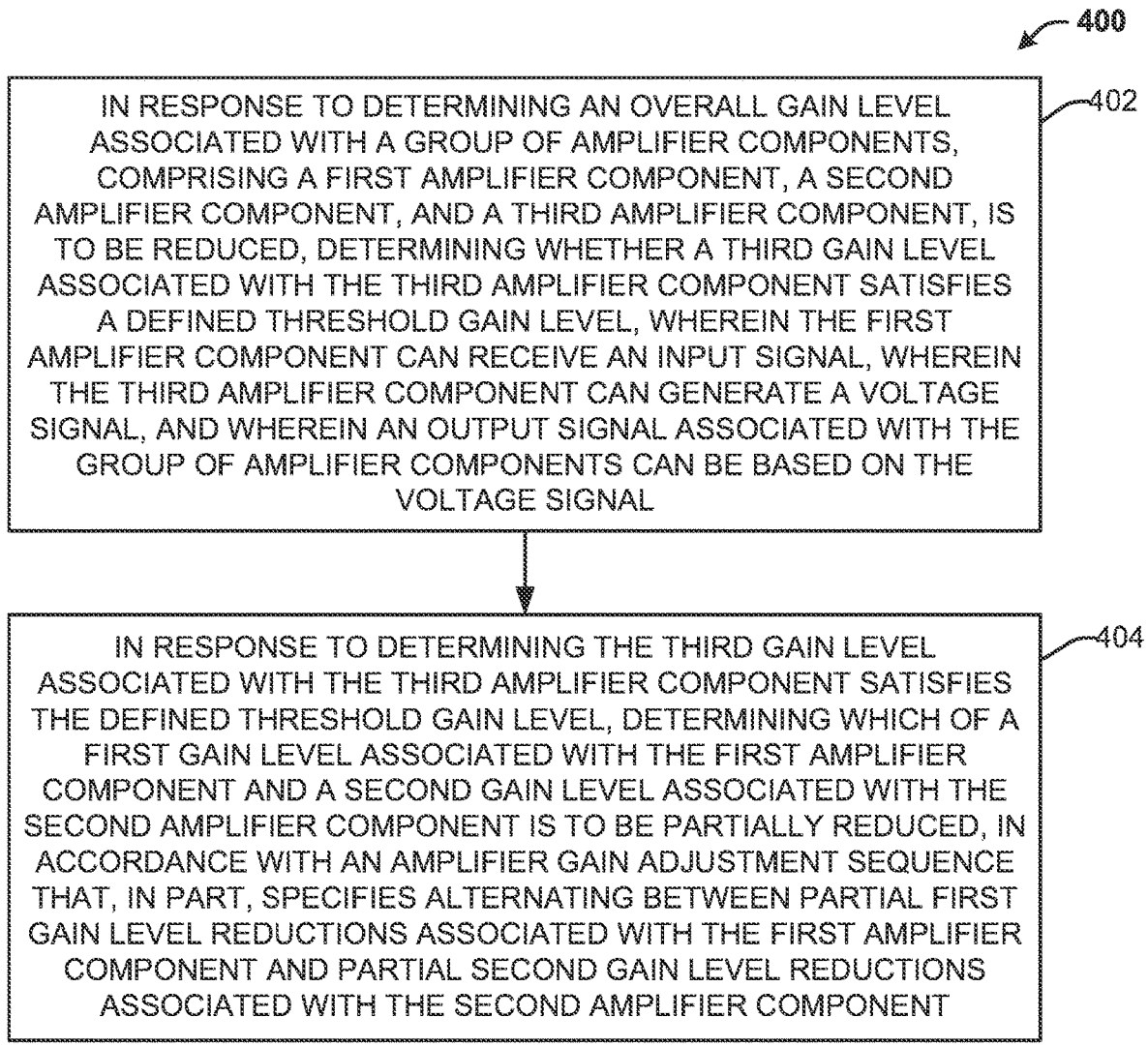
FIG. 4 illustrates a flow chart of an example method that can desirably control adjustments to gain levels associated with amplifier components, in accordance with an amplifier gain adjustment sequence that can facilitate alternating partial gain level reductions associated with certain of the amplifier components, in accordance with various aspects and embodiments of the disclosed subject matter.
Figure 5:
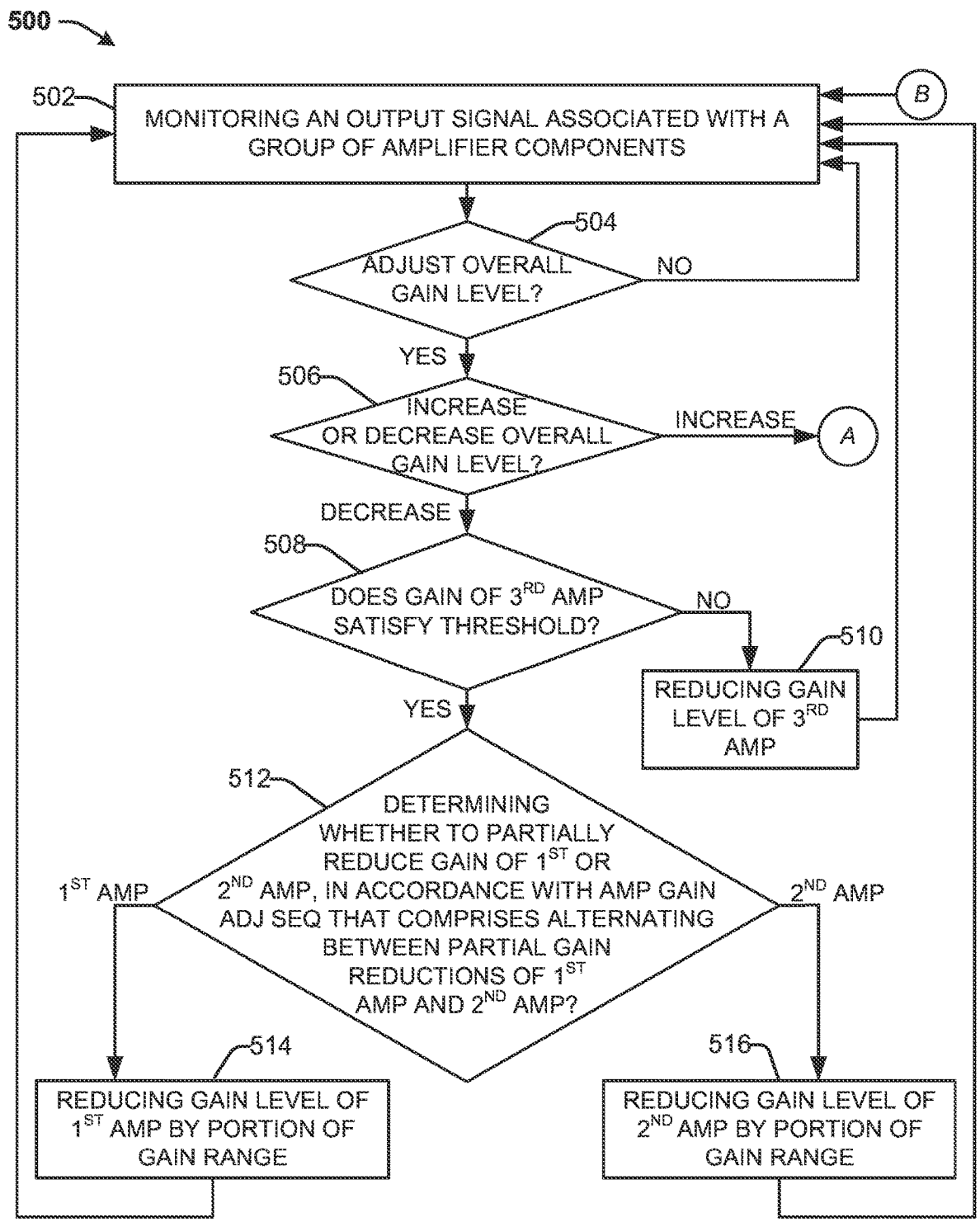
FIG. 5 depicts a flow chart of an example method that can desirably control adjustments to gain levels associated with amplifier components, in accordance with an amplifier gain adjustment sequence that can facilitate alternating partial gain level adjustments associated with certain of the amplifier components, in accordance with various aspects and embodiments of the disclosed subject matter.
Figure 6:
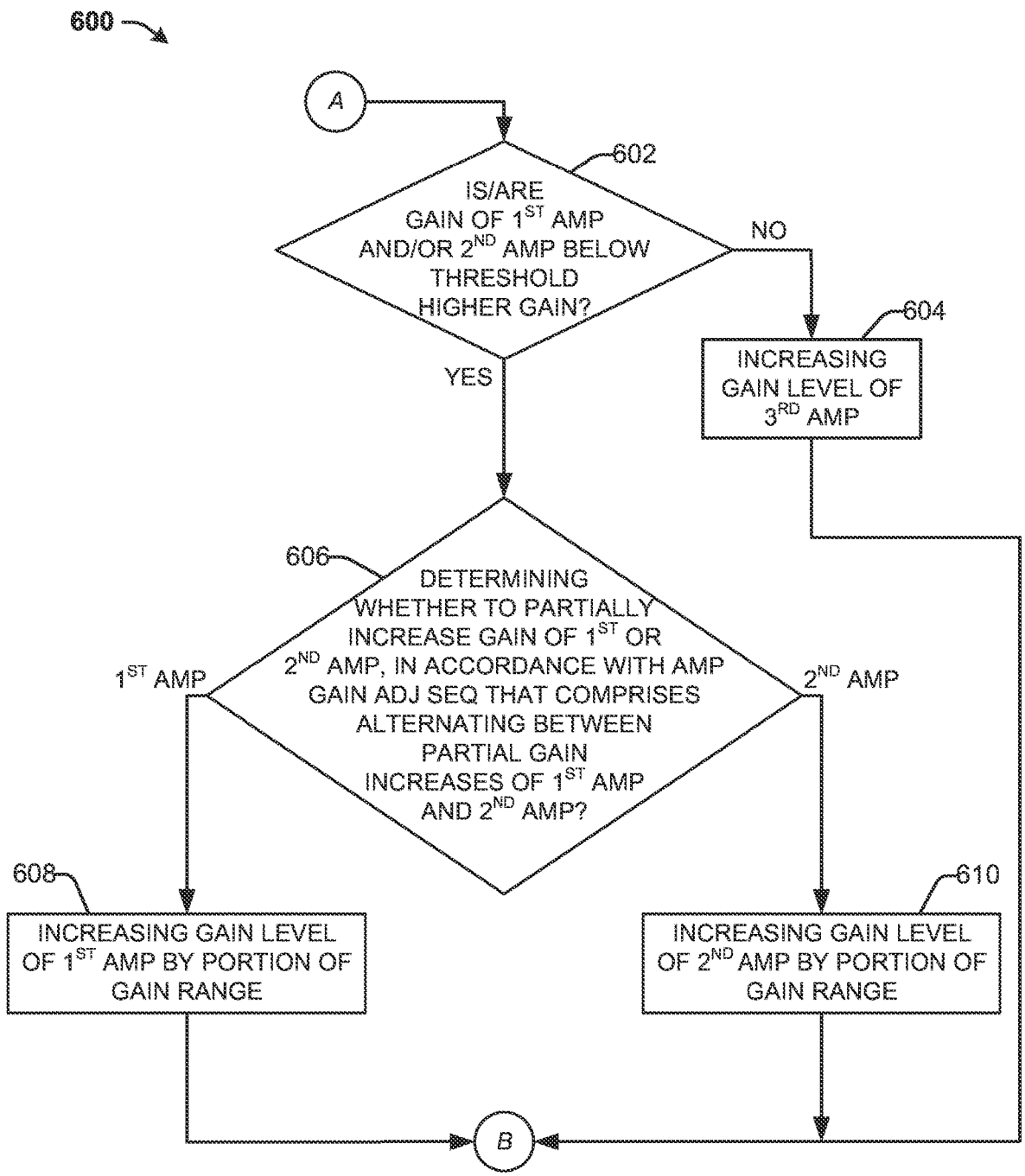
FIG. 6 illustrates a flow chart of an example method that can desirably control increases to gain levels associated with amplifier components, in accordance with an amplifier gain adjustment sequence that can facilitate alternating partial gain level increases (and alternating partial gain level reductions) associated with certain of the amplifier components, in accordance with various aspects and embodiments of the disclosed subject matter.

In view of the example systems and/or devices described herein, example methods that can be implemented in accordance with the disclosed subject matter can be further appreciated with reference to flowcharts in FIGS. 4-6. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a method in accordance with the subject specification. It should be further appreciated that the methods disclosed throughout the subject specification are capable of being stored on an article of manufacture to facilitate transporting and transferring such methods to computers for execution by a processor or for storage in a memory.

FIG. 4 illustrates a flow chart of an example method 400 that can desirably (e.g., suitably, acceptably, enhancedly, or optimally) control adjustments to gain levels associated with amplifier components, in accordance with an amplifier gain adjustment sequence that can facilitate alternating partial gain level reductions associated with certain of the amplifier components, in accordance with various aspects and embodiments of the disclosed subject matter. The method 400 can be employed in connection with a system or device comprising a group of amplifier components, an AGC component and/or a gain manager component, and/or other electrical components or circuitry.

At 402, in response to determining that an overall gain level associated with a group of amplifier components, comprising a first amplifier component, a second amplifier component, and a third amplifier component, is to be reduced, a determination can be made regarding whether a third gain level associated with the third amplifier component satisfies a defined threshold gain level, wherein the first amplifier component can receive an input signal, wherein the third amplifier component can generate a voltage signal, and wherein an output signal associated with the group of amplifier components can be based at least in part on the voltage signal. As part of an AGC or feedback loop, the AGC component and/or controller component can monitor and analyze the output signal (e.g., output voltage signal) associated with the group of amplifier components to facilitate determining whether an adjustment is to be made to an overall gain level (e.g., adjustment to increase or decrease the overall gain level) associated with the group of amplifier components. In some embodiments, the first amplifier component can be a TIA amplifier component, the second amplifier component can be a first VGA amplifier component, and the third amplifier component can be a second VGA amplifier component, such as described herein. In certain embodiments, the group of amplifier components can include one or more additional amplifier components (e.g., VGA amplifier components) than the three amplifier components described with regard to the method 400, and the method 400 can be modified or extended to account for any additional amplifier components (if any), in accordance with the techniques described herein.

The first amplifier component can receive the input signal (e.g., input current signal), and can generate a first voltage signal at a first voltage level based at least in part on a first gain level applied to the input signal. The second amplifier component can receive the first voltage signal from the first amplifier component, and can generate a second voltage signal at a second voltage level based at least in part on a second gain level applied to the first voltage signal. The third amplifier component can receive the second voltage signal from the second amplifier component, and can generate a third voltage signal (e.g., the voltage signal) at a third voltage level based at least in part on a third gain level applied to the second voltage signal. The output signal can be based at least in part on (e.g., can have an output voltage level that can be, or can be a function of) the third voltage signal.

The AGC component and/or controller component can analyze the output signal, and, based at least in part on the result of the analysis, can determine an AGC value, which can be indicative of or correlate to the input signal that was input to the first amplifier component. The AGC component and/or controller component can determine whether the overall gain level associated with the group of amplifier components is to be adjusted (e.g., reduced or increased) based at least in part on the AGC value, an AGC state associated with the AGC value, and/or the current AGC state (e.g., current AGC state prior to changes detected during analysis of this output signal), in accordance with the amplifier gain adjustment sequence.

In response to the AGC component and/or controller component determining that the overall gain level associated with the group of amplifier components is to be reduced, the AGC component and/or controller component can determine whether the third gain level associated with the third amplifier component satisfies (e.g., meets, reaches, or is at) the defined threshold gain level (e.g., the third threshold minimum gain level or other desired defined third threshold gain level) associated with the third amplifier component.

At 404, in response to determining that the third gain level associated with the third amplifier component satisfies the defined threshold gain level, a determination can be made regarding which of a first gain level associated with the first amplifier component and a second gain level associated with the second amplifier component is to be partially reduced, in accordance with an amplifier gain adjustment sequence that, in part, specifies alternating between first groups of partial first gain level reductions associated with the first amplifier component and second groups of partial second gain level reductions associated with the second amplifier component. For instance, in response to the AGC component and/or controller component determining that the third gain level associated with the third amplifier component satisfies the defined threshold gain level, the AGC component and/or controller component can determine which of the first gain level associated with the first amplifier component and the second gain level associated with the second amplifier component is to be partially reduced, in accordance with the amplifier gain adjustment sequence.

In some embodiments, the amplifier gain adjustment sequence can specify alternating between the partial first gain level reductions (e.g., respective first groups of partial first gain level reductions) associated with the first amplifier component and the partial second gain level reductions (e.g., respective second groups of partial second gain level reductions) associated with the second amplifier component, such as described herein. For example, with regard to a number of alternating gain level reductions (e.g., successive or sequential gain level reductions) associated with group of amplifier components, and, in response to determining that the third gain level associated with the third amplifier component satisfies the defined threshold gain level, the amplifier gain adjustment sequence can specify that, with regard to a first group of partial first gain level reductions of the alternating gain level reductions, the first gain level associated with the first amplifier component can be reduced by a first portion(s) of the first gain range associated with the first amplifier component by performing the first group of partial first gain level reductions, which can comprise one or more partial first gain level reductions); with regard to a second gain level reduction of the alternating gain level reductions, the second gain level associated with the second amplifier component can be reduced by a second portion(s) of the second gain range associated with the second amplifier component by performing the second group of partial second gain level reductions, which can comprise one or more partial second gain level reductions); with regard to a third gain level reduction of the alternating gain level reductions, the first gain level associated with the first amplifier component can be further reduced by another first portion(s) of the first gain range associated with the first amplifier component by performing another first group of partial first gain level reductions, which can comprise one or more other partial first gain level reductions); and/or one or more other partial gain level reductions can be performed, in accordance with the amplifier gain adjustment sequence.

FIG. 5 depicts a flow chart of an example method 500 that can desirably (e.g., suitably, acceptably, enhancedly, or optimally) control adjustments to gain levels associated with amplifier components, in accordance with an amplifier gain adjustment sequence that can facilitate alternating partial gain level adjustments associated with certain of the amplifier components, in accordance with various aspects and embodiments of the disclosed subject matter. The method 500 can be employed in connection with a system or device comprising a group of amplifier components, an AGC component and/or a gain manager component (e.g., controller component), and/or other electrical components or circuitry.

At 502, an output signal associated with a group of amplifier components, comprising a first amplifier component, a second amplifier component, and a third amplifier component, can be monitored, wherein the third amplifier component can provide the output signal as an output in response to an input signal to the first amplifier component. In some embodiments, the first amplifier component (e.g., TIA amplifier component) can receive the input signal (e.g., a current signal from a photodiode or other component), and can generate a first voltage signal at a first voltage level based at least in part on a first gain level associated with the first amplifier component. The second amplifier component (e.g., a first VGA ($VGA_0$) amplifier component) can receive the first voltage signal from the first amplifier component, and can generate a second voltage signal at a second voltage level based at least in part on a second gain level associated with the second amplifier component. The third amplifier component (e.g., a second VGA ($VGA_1$) amplifier component) can receive the second voltage signal from the second amplifier component, and can generate a third voltage signal at a third voltage level based at least in part on a third gain level associated with the third amplifier component. The output signal can be, or can be based at least in part on (e.g., can be a function of), the third voltage level.

As part of an AGC or feedback loop, the AGC component and/or controller component can monitor the output signal associated with the group of amplifier components to facilitate determining whether an adjustment is to be made to an overall gain level (e.g., adjustment to increase or decrease the overall gain level) associated with the group of amplifier components. In some embodiments, the first amplifier component can be a TIA amplifier component, the second amplifier component can be a first VGA amplifier component, and the third amplifier component can be a second VGA amplifier component. In certain embodiments, the group of amplifier components can include one or more additional amplifier components (e.g., VGA amplifier components) than the three amplifier components described with regard to the method 500, and the method 500 can be modified or extended to account for any additional amplifier components (if any), in accordance with the techniques described herein.

At 504, based at least in part on the monitoring, a determination can be made regarding whether to adjust the overall gain level associated with the group of amplifier components. For instance, based at least in part on a result of the monitoring and analyzing of the output signal (e.g., analyzing the output voltage signal in relation to a reference voltage signal), the AGC component or controller component can determine whether the overall gain level associated with the group of amplifier components is to be adjusted (e.g., increased or decreased). For example, the output signal can indicate an amount of output voltage swing of the output signal and/or can indicate whether input power to the group of amplifier components is increasing, decreasing, or remaining the same or at least substantially the same. Based at least in part on the result of analyzing the output signal, the AGC component or controller component can determine whether the overall gain level associated with the group of amplifier components is to be decreased (e.g., in response to increased input power), increased (e.g., in response to decreased input power), or remain the same (e.g., in response to no change or insignificant change in input power).

If it is determined that no adjustment is to be made to the overall gain level associated with the group of amplifier components at the time, the method 500 can return to reference numeral 502 to continue monitoring the output signal associated with the group of amplifier components and can continue from that point. For example, in some instances, analysis of the output signal (e.g., output voltage swing of the output signal) can indicate that the input power has remained the same or at least substantially the same. Based at least in part on the result of analyzing such output signal, the AGC component or controller component can determine the AGC state value associated with the output signal, and can determine that the AGC state value is associated with the AGC state that the AGC component is in already (e.g., the AGC state value has not changed from the previous AGC state value, or has only changed by an unsubstantial amount from the previous AGC state value and has not changed enough to satisfy a threshold AGC state value associated with a different AGC state). Accordingly, the AGC component or controller component can determine that no adjustment is to be made to the overall gain level associated with the group of amplifier components at the time. If the AGC component or controller component determines that no adjustment is to be made to the overall gain level associated with the group of amplifier components at the time, the AGC component and/or controller component can continue to monitor the output signal.

If, instead, it is determined that an adjustment is to be made to the overall gain level associated with the group of amplifier components at that time, at 506, a determination can be made regarding whether the overall gain level associated with the group of amplifier components is to be decreased or increased. For instance, based at least in part on the result of the analyzing of the output signal indicating that the overall gain level associated with the group of amplifier components is to be adjusted, the AGC component or controller component can determine whether the overall gain level associated with the group of amplifier components is to be decreased (e.g., in response to increased input power) or increased (e.g., in response to decreased input power).

If it is determined that the overall gain level associated with the group of amplifier components is to be increased, the method 500 can proceed to reference point A, wherein method 600 of FIG. 6 can continue from reference point A, such as described herein. For instance, if the AGC component or controller component determines that the overall gain level associated with the group of amplifier components is to be increased, the AGC component or controller component can perform the operations of the method 600 of FIG. 6, such as described herein.

If, instead, it is determined that the overall gain level associated with the group of amplifier components is to be decreased, at 508, a determination can be made regarding whether the gain level associated with the third amplifier component satisfies a third defined threshold gain level associated with the third amplifier component (e.g., meets, reaches, or is at a third defined threshold minimum gain level or other desired third defined threshold gain level associated with or applicable to the third amplifier component). For example, in certain instances, analysis of the output signal can indicate that the input power has increased. Based at least in part on the result of analyzing such output signal, the AGC component or controller component can determine the AGC state value associated with the output signal, and can determine that the AGC state value has increased such that the AGC state value satisfies a threshold AGC state value associated with a higher AGC state than the current AGC state. Accordingly, the AGC component or controller component can determine that the overall gain level associated with the group of amplifier components is to be decreased (e.g., reduced) at this time. In response to determining that the overall gain level associated with the group of amplifier components is to be decreased, the AGC component or controller component can determine whether the gain level associated with the third amplifier component satisfies the third defined threshold gain level, in accordance with an amplifier gain adjustment sequence. In some embodiments, the AGC component or controller component can know or determine whether the gain level associated with the third amplifier component satisfies the third defined threshold gain level associated with the third amplifier component, based at least in part on the AGC state that the AGC component is in, and/or based at least in part on the logic (e.g., hardware and/or software gain adjustment logic) employed by the AGC component or controller component and/or a look-up table or mapping of AGC states (or AGC state values) to respective adjustments to be made to respective gain levels associated with the respective amplifier components, which can be in accordance with or representative of the amplifier gain adjustment sequence.

If it is determined that the gain level associated with the third amplifier component does not satisfy the third defined threshold gain level, at 510, the gain level associated with the third amplifier component can be reduced. For instance, if the AGC component or controller component determines that the gain level associated with the third amplifier component does not satisfy the third defined threshold gain level, the AGC component or controller component can reduce the gain level associated with the third amplifier component by a portion of the gain range of the third amplifier component (e.g., based at least in part on the output signal, and/or in response to an increase in the input power of the input signal to the first amplifier component), in accordance with the amplifier gain adjustment sequence. At this point, the method 500 can return to reference numeral 502 to continue monitoring the output signal associated with the group of amplifier components and can continue from that point.

Referring again to reference numeral 508, if, instead, it is determined that the gain level associated with the third amplifier component satisfies the third defined threshold gain level, at 512, a determination can be made regarding whether to partially reduce the gain level associated with the first amplifier component or partially reduce the gain level associated with the second amplifier component, in accordance with the amplifier gain adjustment sequence (AMP GAIN ADJ SEQ) that comprises alternating between partial gain reductions associated with the first amplifier component and the second amplifier component (e.g., if the output signal indicates the overall gain level associated with the group of amplifier components is to be decreased). For instance, if, instead, the AGC component or controller component determines that the gain level associated with the third amplifier component satisfies the third defined threshold gain level, the AGC component or controller component can determine whether to partially reduce the gain level associated with the first amplifier component or partially reduce the gain level associated with the second amplifier component, in accordance with the amplifier gain adjustment sequence.

If, at 512, it is determined that the gain level associated with the first amplifier component is to be partially reduced, in accordance with the amplifier gain adjustment sequence (e.g., because the sequence indicates that the gain level associated with the first amplifier component is the first to be partially reduced, or because a second group of partial gain level reductions associated with the second amplifier component was last to be performed and has been completed), at 514, the gain level associated with the first amplifier component can be partially reduced by a portion of an overall gain range associated with the first amplifier component. For instance, if the AGC component or controller component determines that the gain level associated with the first amplifier component is to be partially reduced, based at least in part on the AGC state value (and associated AGC state), in accordance with the amplifier gain adjustment sequence, the AGC component or controller component can partially reduce the gain level associated with the first amplifier component by the portion of the gain range (e.g., 12.5%, or other desired percentage or portion, of the gain range) associated with the first amplifier component. In certain embodiments, due to the arrangement of gain level reductions presented in the amplifier gain adjustment sequence, the AGC component or controller component can know or determine whether the gain level associated with the first amplifier component does not satisfy (e.g., is not at) the first defined threshold gain level (and thus, still can be reduced via a partial gain level reduction), based at least in part on the AGC state that the AGC component is in, and/or based at least in part on the logic employed by the AGC component or controller component and/or the look-up table or mapping of AGC states (or AGC state values) to respective adjustments to be made to respective gain levels associated with the respective amplifier components. At this point, the method 500 can return to reference numeral 502 to continue monitoring the output signal associated with the group of amplifier components and can continue from that point.

Referring again to reference numeral 512, if, instead, it is determined that the gain level associated with the second amplifier component is to be partially reduced, in accordance with the amplifier gain adjustment sequence (e.g., because the sequence indicates that the gain level associated with the second amplifier component is the first to be partially reduced, or because a first group of partial gain level reductions associated with the first amplifier component was last to be performed and has been completed), at 516, the gain level associated with the second amplifier component can be partially reduced by a portion of an overall gain range associated with the second amplifier component. For instance, if the AGC component or controller component determines that the gain level associated with the second amplifier component is to be partially reduced, based at least in part on the AGC state value (and associated AGC state), in accordance with the amplifier gain adjustment sequence, the AGC component or controller component can partially reduce the gain level associated with the second amplifier component by the portion of the gain range (e.g., 12.5%, or other desired percentage or portion, of the gain range) associated with the second amplifier component. In some embodiments, due to the arrangement of gain level reductions presented in the amplifier gain adjustment sequence, the AGC component or controller component can know or determine whether the gain level associated with the second amplifier component does not satisfy the second defined threshold gain level (and thus, still can be reduced via a partial gain level reduction), based at least in part on the AGC state that the AGC component is in, and/or based at least in part on the logic employed by the AGC component or controller component and/or the look-up table or mapping of AGC states (or AGC state values) to respective adjustments to be made to respective gain levels associated with the respective amplifier components. At this point, the method 500 can return to reference numeral 502 to continue monitoring the output signal associated with the group of amplifier components and can continue from that point.

FIG. 6 illustrates a flow chart of an example method 600 that can desirably (e.g., suitably, acceptably, enhancedly, or optimally) control increases to gain levels associated with amplifier components, in accordance with an amplifier gain adjustment sequence that can facilitate alternating partial gain level increases (and alternating partial gain level reductions) associated with certain of the amplifier components, in accordance with various aspects and embodiments of the disclosed subject matter. The method 600 can be employed in connection with a system or device comprising a group of amplifier components, an AGC component and/or a gain manager component, and/or other electrical components or circuitry. In some embodiments, the method 600 can proceed from reference point A, which can stem from reference numeral 506 of the method 500 of FIG. 5, in response to determining that the overall gain level associated with the group of amplifier components is to be increased.

At 602, a determination can be made regarding whether the gain level associated with the first amplifier component and/or the gain level associated with the second amplifier component is or are below their respective threshold higher (e.g., maximum) gain levels. For instance, if the AGC component or controller component determines that the overall gain level is to be increased, the AGC component or controller component can determine whether the gain level associated with the first amplifier component and/or the gain level associated with the second amplifier component is or are below their respective threshold higher gain levels, in accordance with the amplifier gain adjustment sequence. In some embodiments, due to the arrangement of gain level adjustments presented in the amplifier gain adjustment sequence, the AGC component or controller component can know or determine whether the first gain level associated with the first amplifier component and/or the second gain level associated with the second amplifier component are below their respective threshold higher gain levels (and thus, can be increased via a partial gain level increase), based at least in part on the AGC state that the AGC component is in, and/or based at least in part on the logic employed by the AGC component or controller component and/or the look-up table or mapping of AGC states (or AGC state values) to respective adjustments to be made to respective gain levels associated with the respective amplifier components.

If it is determined that the gain level associated with the first amplifier component and the gain level associated with the second amplifier component are not below their respective threshold higher gain levels (e.g., are at their respective threshold maximum gain levels), at 604, a gain level associated with the third amplifier component can be increased. If the AGC component or controller component determines that the gain level associated with the first amplifier component and the gain level associated with the second amplifier component satisfy their respective threshold higher gain levels, the AGC component or controller component can determine that the gain level associated with the third amplifier component is to be increased, and can increase the gain level associated with the third amplifier component by a portion (e.g., 12.5% or other desired higher or lower portion) of the third gain range associated with the third amplifier component (e.g., assuming that the gain level associated with the third amplifier component is not already at its threshold higher or maximum gain level and/or assuming there is not another amplifier component situated between the second amplifier component and the third amplifier component). In certain embodiments, due to the arrangement of gain level adjustments presented in the amplifier gain adjustment sequence, the AGC component or controller component can know or determine whether the third gain level associated with the third amplifier component is to be increased, based at least in part on the AGC state that the AGC component is in, and/or based at least in part on the logic employed by the AGC component or controller component and/or the look-up table or mapping of AGC states (or AGC state values) to respective adjustments to be made to respective gain levels associated with the respective amplifier components. At this point, the method 600 can proceed to reference point B, wherein, from reference point B of the method 500 of FIG. 5, the method 500 can return to reference numeral 502 to continue monitoring the output signal associated with the group of amplifier components and can continue from that point.

If it is determined that the gain level associated with the first amplifier component or the gain level associated with the second amplifier component is or are below their respective threshold higher gain levels, at 606, a determination can be made regarding whether to partially increase the gain level associated with the first amplifier component or partially increase the gain level associated with the second amplifier component, in accordance with the amplifier gain adjustment sequence that comprises alternating between partial gain increases associated with the first amplifier component and the second amplifier component (e.g., if the output signal indicates the overall gain level associated with the group of amplifier components is to be increased). For instance, if, instead, the AGC component or controller component determines that the gain level associated with the first amplifier component and/or the gain level associated with the second amplifier component are below their respective threshold higher gain levels, the AGC component or controller component can determine whether to partially increase the gain level associated with the first amplifier component or partially increase the gain level associated with the second amplifier component, in accordance with the amplifier gain adjustment sequence.

In some embodiments, if the increase to be made in the overall gain level associated with the group of amplifier components is a first increase since the overall gain associated with the group of amplifier components had last been reduced, the AGC component or controller component can determine which of the gain level associated with the first amplifier component or the gain level associated with the second amplifier component is to be partially increased first, in accordance with the amplifier gain adjustment sequence, which can indicate or specify which of those gain levels is to be partially increased first. For instance, when the overall gain level associated with the group of amplifier components is to be increased, if the gain level associated with the first amplifier component was the last gain level to be partially reduced (e.g., to reduce the overall gain level associated with the group of amplifier components), the AGC component or controller component can determine or identify that the gain level associated with the first amplifier component was the last gain level to be partially reduced, and, accordingly, can determine (or at least initially or preliminarily determine) that the gain level associated with the first amplifier component can be partially increased, in accordance with the amplifier gain adjustment sequence. If, instead, the gain level associated with the second amplifier component was the last gain level to be partially reduced, the AGC component or controller component can determine or identify that the gain level associated with the second amplifier component was the last gain level to be partially reduced, and, accordingly, can determine (or at least initially or preliminarily determine) that the gain level associated with the second amplifier component can be partially increased, in accordance with the amplifier gain adjustment sequence.

In some embodiments, due to the arrangement of gain level adjustments presented in the amplifier gain adjustment sequence, the AGC component or controller component can know or determine whether the first gain level associated with the first amplifier component and/or the second gain level associated with the second amplifier component are below their respective threshold higher gain levels (and thus, can be increased via a partial gain level increase), and also can know or determine whether to partially increase the gain level associated with the first amplifier component or partially increase the gain level associated with the second amplifier component, based at least in part on the AGC state that the AGC component is in, and/or based at least in part on the logic employed by the AGC component or controller component and/or the look-up table or mapping of AGC states (or AGC state values) to respective adjustments to be made to respective gain levels associated with the respective amplifier components.

If it is determined that the gain level associated with the first amplifier component is to be partially increased (e.g., because the sequence indicates that the gain level associated with the first amplifier component is the first to be partially increased, or because a second group of partial gain level increases associated with the second amplifier component was last to be performed and has been completed), at 608, the gain level associated with the first amplifier component can be partially increased by a portion of an overall gain range associated with the first amplifier component. For instance, if the AGC component or controller component determines that the gain level associated with the first amplifier component is to be partially increased, in accordance with the amplifier gain adjustment sequence, the AGC component or controller component can partially increase the gain level associated with the first amplifier component by the portion of the overall gain range (e.g., 12.5%, or other desired percentage or portion, of the gain range) associated with the first amplifier component. At this point, the method 600 can proceed to reference point B, where, from reference point B of the method 500 of FIG. 5, the method 500 can return to reference numeral 502 to continue monitoring the output signal associated with the group of amplifier components and can continue from that point.

Referring again to reference numeral 606, if, instead, it is determined that the gain level associated with the second amplifier component is to be partially increased (e.g., because the sequence indicates that the gain level associated with the second amplifier component is the first to be partially increased, or because a first group of partial gain level increases associated with the first amplifier component was last to be performed and has been completed), at 610, the gain level associated with the second amplifier component can be partially increased by a portion of an overall gain range associated with the second amplifier component. For instance, if the AGC component or controller component determines that the gain level associated with the second amplifier component is to be increased, in accordance with the amplifier gain adjustment sequence, the AGC component or controller component can partially increase the gain level associated with the second amplifier component by the portion of the overall gain range (e.g., 12.5%, or other desired percentage or portion, of the gain range) associated with the second amplifier component. At this point, the method 600 can proceed to reference point B, where, from reference point B of the method 500 of FIG. 5, the method 500 can return to reference numeral 502 to continue monitoring the output signal associated with the group of amplifier components and can continue from that point.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like can refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, or other component) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, device, or structure.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips, or other type of magnetic storage device), optical disks (e.g., compact disk (CD), digital versatile disk (DVD), or other type of optical disk), smart cards, and flash memory devices (e.g., card, stick, key drive, or other type of flash memory device). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methods for purposes of describing the disclosed subject matter, but one of ordinary skill in the art can recognize that many further combinations and permutations of the disclosed subject matter are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system that facilitates gain adjustments, comprising:
a group of amplifier components, comprising a transimpedance amplifier component, a first voltage gain amplifier component, and a second voltage gain amplifier component, wherein the transimpedance amplifier component receives an input signal, wherein the second voltage gain amplifier component generates a voltage signal, and wherein an output signal of the system is based at least in part on the voltage signal; and
an automatic gain control component associated with the group of amplifier components, wherein, in response to a determination that a third gain level associated with the second voltage gain amplifier component satisfies a defined gain level, the automatic gain control component determines which of a first gain level associated with the transimpedance amplifier component and a second gain level associated with the first voltage gain amplifier component is to be partially reduced, in accordance with an amplifier gain adjustment sequence that, in part, specifies alternating between partial first gain level reductions associated with the transimpedance amplifier component and partial second gain level reductions associated with the first voltage gain amplifier component.

2. The system of claim 1, wherein the input signal is a current signal, wherein the transimpedance amplifier component converts the current signal to a first voltage signal at a first voltage level based on the first gain level associated with the transimpedance amplifier component,
wherein the first voltage gain amplifier component receives the first voltage signal from the transimpedance amplifier component and generates a second voltage signal at a second voltage level based on the second gain level of the first voltage gain amplifier component,
wherein the voltage signal is a third voltage signal, wherein the second voltage gain amplifier component receives the second voltage signal from the first voltage gain amplifier component and generates the third voltage signal at a third voltage level based on the third gain level of the second voltage gain amplifier component, and wherein the output signal of the system is based on the third voltage signal.

3. The system of claim 1, wherein the automatic gain control component determines a state value associated with the automatic gain control component based at least in part on a result of an analysis of the output signal, wherein the automatic gain control component determines which one of the first gain level associated with the transimpedance amplifier component, the second gain level associated with the first voltage gain amplifier component, and the third gain level associated with the second voltage gain amplifier component is to be at least partially adjusted, based at least in part on the state value and the amplifier gain adjustment sequence, and wherein the amplifier gain adjustment sequence maps respective state values associated with the automatic gain control component to respective adjustments of the first gain level, the second gain level, and the third gain level.

4. The system of claim 1, wherein the amplifier gain adjustment sequence specifies that, with regard to gain reductions associated with the group of amplifier components, in response to the determination that the third gain level satisfies the defined gain level, the first gain level associated with the transimpedance amplifier component is to be partially reduced by a first group of portions of a first gain range associated with the transimpedance amplifier component as part of a first group of the partial first gain level reductions, subsequently, the second gain level associated with the first voltage gain amplifier component is to be partially reduced by a second group of portions of a second gain range associated with the first voltage gain amplifier component as part of a second group of the partial second gain level reductions, and, subsequently, the first gain level associated with the transimpedance amplifier component is to be partially reduced by a third group of portions of the first gain range associated with the transimpedance amplifier component as part of a third group of the partial first gain level reductions.

5. The system of claim 1, wherein the amplifier gain adjustment sequence specifies that, with regard to gain reductions associated with the group of amplifier components, in response to the determination that the third gain level satisfies the defined gain level, the second gain level associated with the first voltage gain amplifier component is to be partially reduced by a second group of portions of a second gain range associated with the first voltage gain amplifier component as part of a second group of the partial second gain level reductions, subsequently, the first gain level associated with the transimpedance amplifier component is to be partially reduced by a first group of portions of a first gain range associated with the transimpedance amplifier component as part of a first group of the partial first gain level reductions, and, subsequently, the second gain level associated with the first voltage gain amplifier component is to be partially reduced by a third group of portions of the second gain range associated with the first voltage gain amplifier component as part of a third group of the partial second gain level reductions.

6. The system of claim 1, wherein the determination is a second determination, wherein, in response to a first determination that the output signal indicates that an overall gain level associated with the group of amplifier components is to be reduced, and in response to the second determination that the third gain level associated with the second voltage gain amplifier component satisfies the defined gain level, the automatic gain control component determines that the second gain level associated with the first voltage gain amplifier component is to be partially reduced, and partially reduces the second gain level by a portion of a second gain range associated with the first voltage gain amplifier component as part of the partial second gain level reductions, in accordance with the amplifier gain adjustment sequence.

7. The system of claim 6, wherein, subsequent to the second determination and the partial reduction of the second gain level by the second portion of the first gain range, and in response to a third determination that the output signal indicates that the overall gain level associated with the group of amplifier components is to be reduced, the automatic gain control component determines that the first gain level associated with the transimpedance amplifier component is to be partially reduced, and partially reduces the first gain level by a first portion of a first gain range associated with the transimpedance amplifier component as part of the partial first gain level reductions, in accordance with the amplifier gain adjustment sequence.

8. The system of claim 7, wherein, subsequent to the third determination and partial reduction of the first gain level by a first group of portions, comprising the first portion, of the first gain range, and in response to a fourth determination that the output signal indicates that the overall gain level associated with the group of amplifier components is to be reduced, the automatic gain control component determines that the second gain level associated with the first voltage gain amplifier component is to be partially reduced, and partially reduces the second gain level by a third portion of the second gain range associated with the first voltage gain amplifier component as part of the partial second gain level reductions, in accordance with the amplifier gain adjustment sequence.

9. The system of claim 1, wherein the determination is a second determination, wherein, in response to a first determination that the output signal indicates that an overall gain level associated with the group of amplifier components is to be reduced, and in response to the second determination that the third gain level associated with the second voltage gain amplifier component satisfies the defined gain level, the automatic gain control component determines that the first gain level associated with the transimpedance amplifier component is to be partially reduced, and partially reduces the first gain level by a first portion of a first gain range associated with the transimpedance amplifier component as part of the partial first gain level reductions, in accordance with the amplifier gain adjustment sequence.

10. The system of claim 1, wherein the determination is a first determination, wherein, in response to a second determination that an overall gain level associated with the group of amplifier components is to be increased, the automatic gain control component determines which of the first gain level associated with the transimpedance amplifier component and the second gain level associated with the first voltage gain amplifier component is to be partially increased, in accordance with the amplifier gain adjustment sequence that, in part, specifies alternating between partial first gain level increases associated with the transimpedance amplifier component and partial second gain level increases associated with the first voltage gain amplifier component.

11. The system of claim 1, further comprising:
a gain manager component that comprises a processor that performs operations in accordance with the amplifier gain adjustment sequence, wherein the gain manager component receives an error signal from the automatic gain control component, wherein the error signal is based on the output signal,
wherein, based on the error signal, the gain manager component determines or facilitates determining which of the first gain level and the second gain level is to be partially reduced, in accordance with the amplifier gain adjustment sequence, to generate a determination result, and communicates a control signal, corresponding to the determination result, to the automatic gain control component to facilitate partial reducing the first gain level or partially reducing the second gain level.

12. The system of claim 1, wherein the output signal is a second output signal that occurs prior to a first output signal, wherein, in response to determining that the first output signal indicates that an overall gain level associated with the group of amplifier components is to be reduced, the automatic gain control component determines whether the third gain level associated with the second voltage gain amplifier component satisfies the defined gain level, wherein the output signal indicating that the overall gain level associated with the group of amplifier components is to be reduced is an indication that an input power of the input signal has increased, and wherein, in response to determining that the third gain level associated with the second voltage gain amplifier component does not satisfy the defined gain level, the automatic gain control component reduces the third gain level by a defined amount, in accordance with the amplifier gain adjustment sequence.

13. A device that facilitates gain modifications, comprising:
a group of amplifier components, comprising a first amplifier component, a second amplifier component, and a third amplifier component, wherein the first amplifier component receives an input signal, wherein the third amplifier component generates a voltage signal, and wherein an output signal associated with the group of amplifier components is based at least in part on the voltage signal; and
a controller component associated with the group of amplifier components, wherein, in response to a determination that a third gain level associated with the third amplifier component satisfies a defined threshold gain level, the controller component determines which of a first gain level associated with the first amplifier component and a second gain level associated with the second amplifier component is to be partially decreased, in accordance with an amplifier gain modification arrangement that, in part, indicates alternating between partial first gain level decreases associated with the first amplifier component and partial second gain level decreases associated with the second amplifier component.

14. The device of claim 13, wherein the input signal is a current signal, wherein the voltage signal is a third voltage signal,
wherein the first amplifier component comprises a transimpedance amplifier component that converts the current signal to a first voltage signal at a first voltage level based on the first gain level associated with the transimpedance amplifier component,
wherein the second amplifier component comprises a first voltage gain amplifier component that receives the first voltage signal from the transimpedance amplifier component and generates a second voltage signal at a second voltage level based on the second gain level of the first voltage gain amplifier component, and
wherein the third amplifier component comprises a second voltage gain amplifier component that receives the second voltage signal from the first voltage gain amplifier component and generates the third voltage signal at a third voltage level based on the third gain level of the second voltage gain amplifier component, and wherein the output signal is based on the third voltage signal.

15. The device of claim 13, wherein the amplifier gain modification arrangement indicates that, with regard to gain decreases associated with the group of amplifier components, in response to the determination that the third gain level satisfies the defined threshold gain level, the first gain level associated with the first amplifier component is to be partially decreased by a first group of portions of a first gain range associated with the first amplifier component as part of a first group of the partial first gain level decreases, subsequently, the second gain level associated with the second amplifier component is to be partially decreased by a second group of portions of a second gain range associated with the second amplifier component as part of a second group of the partial second gain level decreases, and, subsequently, the first gain level associated with the first amplifier component is to be partially decreased by a third group of portions of the first gain range associated with the first amplifier component as part of a third group of the partial first gain level decreases.

16. The device of claim 13, wherein the amplifier gain modification arrangement indicates that, with regard to gain decreases associated with the group of amplifier components, in response to the determination that the third gain level satisfies the defined threshold gain level, the second gain level associated with the second amplifier component is to be partially decreased by a second group of portions of a second gain range associated with the second amplifier component as part of a second group of the partial second gain level decreases, subsequently, the first gain level associated with the first amplifier component is to be partially decreased by a first group of portions of a first gain range associated with the first amplifier component as part of a first group of the partial first gain level decreases, and, subsequently, the second gain level associated with the second amplifier component is to be partially decreased by a third group of portions of the second gain range associated with the second amplifier component as part of a third group of the partial second gain level decreases.

17. The device of claim 13, wherein the determination is a first determination, wherein, in response to a second determination that an overall gain level associated with the group of amplifier components is to be increased, the controller component determines which of the first gain level associated with the first amplifier component and the second gain level associated with the second amplifier component is to be partially increased, in accordance with the amplifier gain modification arrangement that, in part, indicates alternating between partial first gain level increases associated with the first amplifier component and partial second gain level increases associated with the second amplifier component.

18. A method that facilitates gain adjustments, comprising:
in response to determining that an overall gain level associated with a group of amplifiers, comprising a first amplifier, a second amplifier, and a third amplifier, is to be reduced, determining whether a third gain level associated with the third amplifier satisfies a defined threshold gain level, wherein the first amplifier receives an input signal, wherein the third amplifier generates a voltage signal, and wherein an output signal associated with the group of amplifiers is based at least in part on the voltage signal; and
in response to determining that the third gain level associated with the third amplifier satisfies the defined threshold gain level, determining which of a first gain level associated with the first amplifier and a second gain level associated with the second amplifier is to be partially reduced, in accordance with an amplifier gain adjustment sequence that, in part, specifies alternating between partial first gain level reductions associated with the first amplifier and partial second gain level reductions associated with the second amplifier.

19. The method of claim 18, wherein the amplifier gain adjustment sequence indicates that, with regard to gain reductions associated with the group of amplifier components, in response to the determination that the third gain level satisfies the defined threshold gain level, the first gain level associated with the first amplifier component is to be partially reduced by a first group of portions of a first gain range associated with the first amplifier component as part of a first group of the partial first gain level reductions, subsequently, the second gain level associated with the second amplifier component is to be partially reduced by a second group of portions of a second gain range associated with the second amplifier component as part of a second group of the partial second gain level reductions, and, subsequently, the first gain level associated with the first amplifier component is to be partially reduced by a third group of portions of the first gain range associated with the first amplifier component as part of a third group of the partial first gain level reductions.

20. The method of claim 18, wherein the amplifier gain modification sequence indicates that, with regard to gain reductions associated with the group of amplifier components, in response to the determination that the third gain level satisfies the defined threshold gain level, the second gain level associated with the second amplifier component is to be partially reduced by a second group of portions of a second gain range associated with the second amplifier component as part of a second group of the partial second gain level reductions, subsequently, the first gain level associated with the first amplifier component is to be partially reduced by a first group of portions of a first gain range associated with the first amplifier component as part of a first group of the partial first gain level reductions, and, subsequently, the second gain level associated with the second amplifier component is to be partially reduced by a third group of portions of the second gain range associated with the second amplifier component as part of a third group of the partial second gain level reductions.

* * * * *